(12) United States Patent
Rim et al.

(10) Patent No.: US 11,664,087 B2
(45) Date of Patent: May 30, 2023

(54) SEMICONDUCTOR DEVICE

(71) Applicant: SK hynix Inc., Icheon-si (KR)

(72) Inventors: A Ram Rim, Icheon-si (KR); Tae Sik Yun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/490,443

(22) Filed: Sep. 30, 2021

(65) Prior Publication Data

US 2022/0406399 A1 Dec. 22, 2022

(30) Foreign Application Priority Data

Jun. 21, 2021 (KR) ........................ 10-2021-0080445

(51) Int. Cl.
*G11C 29/00* (2006.01)

(52) U.S. Cl.
CPC .......... *G11C 29/808* (2013.01); *G11C 29/785* (2013.01); *G11C 29/846* (2013.01)

(58) Field of Classification Search
CPC .... G11C 29/808; G11C 29/785; G11C 29/846
See application file for complete search history.

(56) References Cited

U.S. PATENT DOCUMENTS

2016/0104546 A1* 4/2016 Yun ........................ G11C 29/24
365/189.07
2019/0304565 A1* 10/2019 Kim ........................ G11C 8/12

FOREIGN PATENT DOCUMENTS

KR 1020120020822 A 3/2012

* cited by examiner

*Primary Examiner* — Mohammed A Bashar
(74) *Attorney, Agent, or Firm* — William Park & Associates Ltd.

(57) ABSTRACT

A semiconductor device includes a memory bank including a first memory block, a second memory block, and a redundancy memory block, and a column line selection circuit configured, when a fail occurs in a first column line of the first memory block, to replace the first column line of the first memory block with a first redundancy line of the redundancy memory block, and replace a second column line of the second memory block with a second redundancy line of the redundancy memory block.

33 Claims, 36 Drawing Sheets

FIG.6

| MB IN 121 | YL<1> | YL<2> | ••• | YL<32> |
|---|---|---|---|---|
| 125 | RYL<1> | RYL<2> | ••• | RYL<32> |
| MB IN 123 | YL<33> | YL<34> | ••• | YL<64> |
| 125 | RYL<33> | RYL<34> | ••• | RYL<64> |
| RFUSE LATCH | 131_1 | 131_2 | ••• | 131_32 |

FIG.9

| MB IN 121 | YL<33> | YL<34> | ... | YL<64> |
|---|---|---|---|---|
| 125 | RYL<1> | RYL<2> | ... | RYL<32> |
| MB IN 123 | YL<1> | YL<2> | ... | YL<32> |
| 125 | RYL<33> | RYL<34> | ... | RYL<64> |
| RFUSE LATCH | 131_1 | 131_2 | ... | 131_32 |

FIG.13

| NFUSE LATCH | YL<1> | YL<2> | ••• | YL<16> | YL<17> | ••• | YL<32> |
|---|---|---|---|---|---|---|---|
| | YL<17> | YL<18> | ••• | YL<32> | YL<1> | ••• | YL<16> |

FIG.14

| NFUSE | YL<33> | YL<34> | ... | YL<48> | YL<49> | ... | YL<64> |
|-------|--------|--------|-----|--------|--------|-----|--------|
| LATCH | YL<49> | YL<50> | ... | YL<64> | YL<33> | ... | YL<48> |

FIG.23

| FLAT | FCAD | |
|---|---|---|
| L | L | SFT1="H" |
| | H | SFT2="H" |
| H | H | SFT1="H" |
| | L | SFT2="H" |

US 11,664,087 B2

SEMICONDUCTOR DEVICE

CROSS-REFERENCE TO RELATED APPLICATIONS

The present application claims priority under 35 U.S.C. 119(a) to Korean Patent Application No. 10-2021-0080445, filed on Jun. 21, 2021, which is incorporated herein by reference in its entirety.

BACKGROUND

1. Technical Field

Embodiments of the present disclosure relate to semiconductor device, and more particularly to a semiconductor device related to performing a test operation before or after a repair operation.

2. Related Art

A semiconductor device performs a repair operation of replacing a defective memory cell (hereinafter, referred to as a "fail cell") with a redundancy cell. The repair operation of the semiconductor device includes a row pair operation and a column repair operation. The row pair operation is performed in such a way that, when there is a fail cell among memory cells connected to a row line (e.g., a word line) selected based on a row address, the row line to which the fail cell is connected is replaced with a redundancy row line. The column repair operation is performed in such a way that, when there is a fail cell among memory cells connected to a column line (e.g., a bit line) selected based on a column address, the column line to which the fail cell is connected is replaced with a redundancy column line.

SUMMARY

According to an embodiment of the present disclosure, there is provided a semiconductor device. The semiconductor device may include a memory bank including a first memory block, a second memory block, and a redundancy memory block, and a column line selection circuit configured, when a fail occurs in a first column line of the first memory block, to replace the first column line of the first memory block with a first redundancy line of the redundancy memory block, and replace a second column line of the second memory block with a second redundancy line of the redundancy memory block.

In addition, according to another embodiment of the present disclosure, there is provided a semiconductor device. The semiconductor device may include a test column address generator configured to generate a first test column address and a second test column address based on a column address; and a core circuit configured to control a first repair operation for a first memory block array and a second repair operation for a second memory block array to be performed together based on a block array address, a block address, and the column address, select one of column lines of each of memory blocks included in the first memory block array to output first memory block data based on the first test column address, and select one of column lines of each of memory blocks included in the second memory block array to output second memory block data based on the second test column address.

In addition, according to another embodiment of the present disclosure, there is provided a semiconductor device. The semiconductor device may include a core circuit configured to: control a first repair operation on a first memory block array and a second repair operation on a second memory block array to be performed together based on a block array address, a block address, and a column address, select one of column lines of each of memory blocks included in the first memory block array based on a first test column address to output first memory block data, select one of column lines of each of memory blocks included in the second memory block array based on a second test column address to output second memory block data, and output redundancy memory block data when the repair operation on the first memory block array is performed based on the first test column address or the repair operation on the first memory block array is performed based on the second test column address; an input/output control circuit configured to generate first drive data and second drive data from the first memory block data, the second memory block data, and the redundancy memory block data based on a first shifting signal and a second shifting signal; and a test data generator configured to compare the first drive data and first reference data to generate a first comparison signal, compare the second drive data and second reference data to generate a second comparison signal, and compress the first comparison signal and the second comparison signal to generate test data.

BRIEF DESCRIPTION OF THE DRAWINGS

FIGS. 6, 7, 8, 9, 10, and 11 are diagrams for explaining a repair operation performed based on redundancy fuse data in the semiconductor device shown in FIG. 1.

FIGS. 12, 13, and 14 are diagrams for explaining a repair operation performed based on normal fuse data in the semiconductor device shown in FIG. 1.

FIG. 23 is a table for explaining an operation of the shifting control circuit shown in FIGS. 21 and 22.

DETAILED DESCRIPTION

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
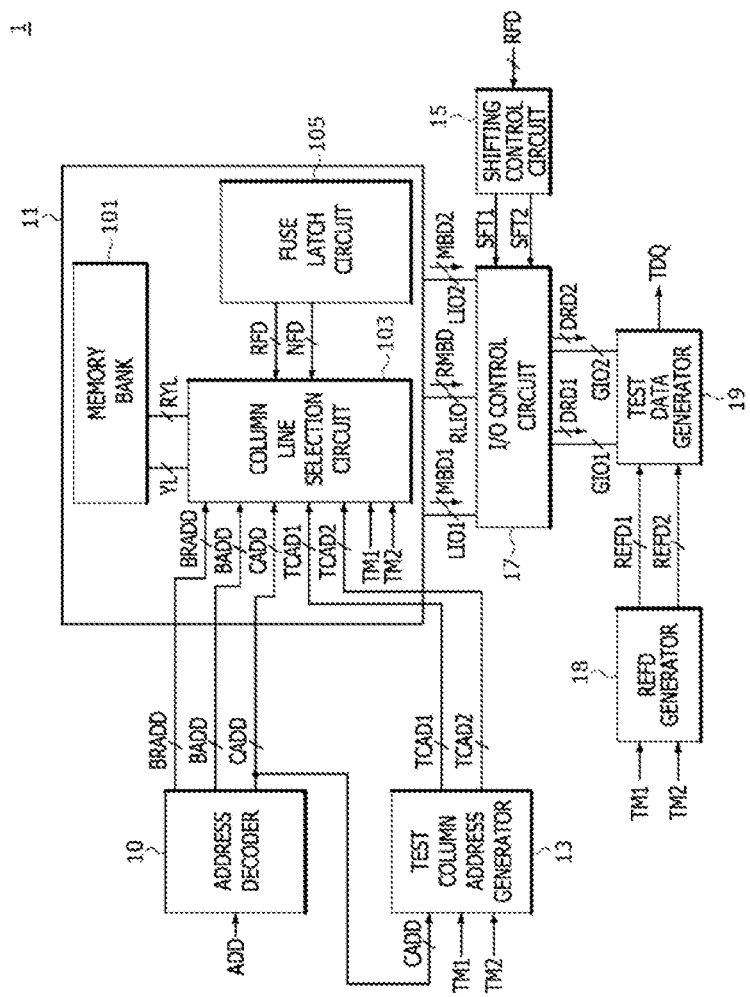
FIG. 1 is a block diagram illustrating a configuration of a semiconductor device according to an embodiment of the present disclosure.

FIG. 1 is a block diagram illustrating a configuration of a semiconductor device 1 according to an embodiment of the present disclosure. As illustrated in FIG. 1, the semiconductor device 1 may include an address decoder 10, a core circuit 11, a test column address generator 13, a shifting control circuit 15, an input/output (I/O) control circuit 17, a reference (REFD) data register 18, and a test data generator 19.

The address decoder 10 may receive an address ADD from an external device (not shown) of the semiconductor device 1. The external device of the semiconductor device 1 may be one of a semiconductor controller, a host, and a test device. The address decoder 10 may decode the address ADD to generate a block array address BRADD, a block address BADD, and a column address CADD. The block array address BRADD may be set to have a logic bit for selecting one of a first memory block array (121 of FIG. 2) and a second memory block array (123 of FIG. 2) included in a memory bank (101 of FIG. 2). The block address BADD may be set to have a logic bit set for selecting one of memory blocks (MB of FIG. 2) included in the selected memory block array. The number of bits included in the block address BADD may be set according to the number of memory blocks MB included in the first memory block array 121 and the second memory block array 123. For example, when the number of memory blocks MB included in each of the first memory block array 121 and the second memory block array 123 is 16, the block address BADD may be implemented to include 4 bits. The column address CADD may include bits having a logic bit set for selecting one of column lines YL of the memory block MB selected by the block address BADD. The number of bits included in the column address CADD may be set according to the number of column lines YL included in the memory block MB. For example, when the number of column lines YL included in the memory block MB is 64, the column address CADD may be implemented to include 6 bits.

The core circuit 11 may receive the block array address BRADD, the block address BADD, and the column address CADD from the address decoder 10. The core circuit 11 may receive a first test column address TCAD1 and a second test column address TCAD2 from the test column address generator 13. The first test column address TCAD1 and the second test column address TCAD2 may be generated based on the column address CADD in order to perform pre-test for checking fails that need to be repaired and post-test for checking whether a repair operation has been properly performed. The core circuit 11 may receive a first test mode signal TM1 for performing pre-test and a second test mode signal TM2 for perform post-test. The first test mode signal TM1 and the second test mode signal TM2 may be generated by decoding a command (not shown) inside the semiconductor device 1 or may be received from an external device (not shown) of the semiconductor device 1. The core circuit 11 may include a memory bank 101, a column line selection circuit 103, and a fuse latch circuit 105. In this embodiment, for convenience of explanation, the core circuit 11 is implemented to include one memory bank 101, but may be implemented to include a plurality of memory banks according to embodiments.

Figure 2:
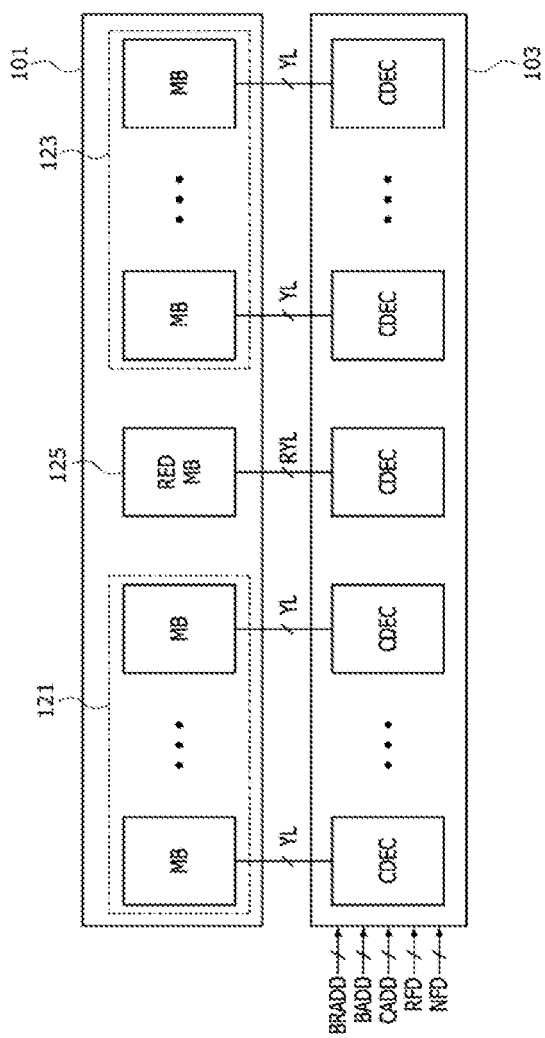
FIG. 2 is a block diagram illustrating a configuration according to an example of a memory bank and a configuration according to an example of a column line selection circuit included in the semiconductor device shown in FIG. 1.

The memory bank 101 may be connected to a plurality of column lines YL and a plurality of redundancy column lines RYL. The memory bank 101 may include a first memory block array 121 and a second memory block array 123 that include memory blocks MB connected to the plurality of column lines YL, as illustrated in FIG. 2. The memory bank 101 may include a redundancy memory block (RED MB) (125 of FIG. 2) connected to the plurality of redundancy column lines RYL.

The column line selection circuit 103 may select one of the first memory block array 121 and the second memory block array 123 based on the block array address BRADD, and may select one of the memory blocks MB based on the block address BADD. The column line selection circuit 103 may select one of the column lines YL of the memory block MB based on the column address CADD. The column line selection circuit 103 may control at least one memory cell (not shown) connected to the column line YL of the memory block selected based on the block array address BRADD, the block address BADD, and the column address CADD to be accessed. Hereinafter, it is assumed and explained that the occurrence of a fail in the column line YL of the memory block MB selected based on the block array address BRADD, the block address BADD, and the column address CADD means that a fail cell is included among the memory cells connected to the column line YL of the memory block MB selected based on the block array address BRADD, the block address BADD, and the column address CADD.

The column line selection circuit 103 may receive redundancy fuse data RFD and normal fuse data NFD from the fuse latch circuit 105. The column line selection circuit 103 may control the memory bank 101 so that repair operations on the column lines YL of the plurality of memory blocks MB are simultaneously performed based on the redundancy fuse data RFD. A column line YL of each of the plurality of memory blocks MB on which the repair operations are simultaneously performed may be selected based on the block array address BRADD, the block address BADD, and the column address CADD. The column line selection circuit 103 may control the memory bank 101 so that the repair operation on the column line YL of the memory block MB selected by the block array address BRADD, the block address BADD, and the column address CADD are performed based on the normal fuse data NFD. The words "simultaneous" and "simultaneously" as used herein with respect to processes or operations mean that the processes or operations take place on overlapping intervals of time. For example, if a first process or operation takes place over a first interval of time and a second process or operation takes place simultaneously over a second interval of time, then the first and second intervals at least partially overlap each other such that there exists a time at which the first and second processes or operations are both taking place.

The column line selection circuit 103 may output data of the memory cells connected to one of the column lines YL of the memory blocks MB included in the first memory block array 121, selected by the first test column address TCAD1 as first memory block data MBD1 through a first local line LIO1 when the first test mode signal TM1 is received in order to perform pre-test to check a fail cell requiring repair. In addition, the column line selection circuit 103 may output data of the memory cells connected to another one among the column lines YL of the memory blocks MB included in the second memory block array 123, selected by the second test column address TCAD2 as second memory block data MBD2 through a second local line LIO2 when the first test mode signal TM1 is received. In the pre-test, the first test column address TCAD1 and the second test column address TCAD2 may be set to have different logic bit sets to select the column lines YL that are repaired together.

The column line selection circuit 103 may output data of the memory cells connected to one the column lines YL of the memory blocks MB included in the first memory block array 121, selected by the first test column address TCAD1 as first memory block data MBD1 through the first local line LIO1 when the second test mode signal TM2 is received in order to perform post-test to check whether a repair operation has been performed properly. In addition, the column line selection circuit 103 may output data of the memory cells connected to one of the column lines YL of the memory blocks MB included in the second memory block array 123, selected by the second test column address TCAD2 as second memory block data MBD2 through the second local line LIO2 when the second test mode signal TM2 is received. In the post-test, the first test column address TCAD1 and the second test column address TCAD2 may be set to have the same logic bit set to select the same column line YL. When the second test mode signal TM2 is received and one of the column lines YL of the memory blocks MB included in the first memory block array 121, selected by the first test column address TCAD1 is replaced with one of the redundancy column lines RYL, the column line selection circuit 103 may output data of the redundancy memory cells connected to the one of the redundancy column lines RYL as redundancy memory block data RMBD through a redundancy local line RLIO. Meanwhile, when the second test mode signal TM2 is received and one of the column lines YL of the memory blocks MB included in the second memory block array 123, selected by the second test column address TCAD2 is replaced with the other of the redundancy column lines RYL, the column line selection circuit 103 may output data of the redundancy memory cells connected to the other of the redundancy column lines RYL as redundancy memory block data RMBD through the redundancy local line RLIO.

The fuse latch circuit 105 may store redundancy fuse data RFD for controlling the repair operation on the column line YL of each of the plurality of memory blocks MB selected based on the block array address BRADD, the block address BADD, and the column address CADD to be performed together. The fuse latch circuit 105 may store normal fuse data NFD for controlling a repair operation in which one of the column lines YL included in one of the memory blocks MB selected based on the block array address BRADD, the block address BADD, and the column address CADD is replaced with another one of the column lines YL. The fuse latch circuit 105 may apply the redundancy fuse data RFD and the normal fuse data NFD stored therein to the column line selection circuit 103.

The test column address generator 13 may receive the column address CADD from the address decoder 10 and may receive the first test mode signal TM1 and the second test mode signal TM2. The test column address generator 13 may generate the first test column address TCAD1 and the second test column address TCAD2 from the column address CADD based on the first test mode signal TM1 and the second test mode signal TM2. The test column address generator 13 may buffer the column address CADD to generate the first test column address TCAD1, and may generate the second test column address TCAD2 by buffering the column address CADD, wherein by inversely buffering at least one bit among bits included in the column address CADD when the first test mode signal TM1 is received to perform a pre-test. One of the column lines YL selected by the first test column address TCAD1 and the other one of the column lines YL selected by the second test column address TCAD2 generated in the pre-test may be set to be repaired together after the pre-test. The test column address generator 13 may buffer the column address CADD to generate the first test column address TCAD1 and the second test column address TCAD2 when the second test mode signal TM2 is received to perform post-test.

The shifting control circuit 15 may receive the redundancy fuse data RFD from the fuse latch circuit 105. The shifting control circuit 15 may generate a first shifting signal SFT1 and a second shifting signal SFT2 based on the redundancy fuse data RFD. The shifting control circuit 15 may generate the first shifting signal SFT1 and the second shifting signal SFT2 that are both deactivated based on the redundancy fuse data RFD when a repair operation is not performed. The shifting control circuit 15 may generate a first shifting signal SFT1 activated and a second shifting signal SFT2 deactivated based on the redundancy fuse data RFD when a fail cell is included in one of the memory blocks MB included in the first memory block array 121 and is repaired. The shifting control circuit 15 may generate a first shifting signal SFT1 deactivated and a second shifting signal SFT2 activated based on the redundancy fuse data RFD when a fail cell is included in one of the memory blocks MB included in the second memory block array 123 and is repaired.

The input/output control circuit 17 may receive the first memory block data MBD1, the second memory block data MBD2, and the redundancy memory block data RMBD from the core circuit 11. The input/output control circuit 17 may receive the first shifting signal SFT1 and the second shifting signal SFT2 from the shifting control circuit 15. The input/output control circuit 17 may drive a first drive data DRD1 from the first memory block data MBD1 received through the first local line LIO1 and output the first drive data DRD1 through a first global line GIL1 when a deactivated first shifting signal SFT1 is received. The input/output control circuit 17 may drive a second drive data DRD2 from the second memory block data MBD2 received through the second local line LIO1 and output the second drive data DRD2 through a second global line GIL2 when a deactivated second shifting signal SFT2 is received. When fail cells are included in the memory blocks MB included in the first memory block array 121 and an activated first shifting signal SFT1 is received, the input/output control circuit 17 may sequentially shift a portion of the first memory block data MBD1 received through the first local line LIO1 and the redundancy memory block data RMBD received through the redundancy local line RLIO, drive the first drive data DRD1 from a portion of the shifted first memory block data MBD1 and the redundancy memory block data RMBD, and output the first drive data DRV1 through the first global line GIO1. When fail cells are included in the memory blocks MB included in the second memory block array 123 and an activated second shifting signal SFT2 is received, the input/output control circuit 17 may sequentially shift a portion of the second memory block data MBD2 received through the second local line LIO2 and the redundancy memory block data RMBD received through the redundancy local line RLIO, drive the second drive data DRD1 from a portion of the shifted second memory block data MBD2 and the redundancy memory block data RMBD, and output the second drive data DRV1 through the second global line GIO2.

The reference data register 18 may store first reference data REFD1 and second reference data REFD2 based on the first test mode signal TM1 and the second test mode signal TM2, and apply the stored first reference data REFD1 and second reference data REFD2 to the test data generator 19. The reference data register 18 may store the first reference data REFD1 set to have the same logic bit set as the first drive data DRD1 generated when no fail cells are included in the first memory block array 121, and apply the stored first reference data REFD1 to the test data generator 19 when the first test mode signal TM1 activated for the pre-test is received. In addition, the reference data register 18 may store the second reference data REFD2 set to have the same logic bit set as the second drive data DRD2 generated when no fail cells are included in the second memory block array 123, and apply the stored second reference data REFD2 to the test data generator 19 when the first test mode signal TM1 activated for the pre-test is received. Meanwhile, when the activated second test mode signal TM2 for post-test is received, the reference data register 18 may store the first reference data REFD1 set to have the same logic bit set as the first drive data DRD1 generated when no fail cells are included in the first memory block array 121 or when fail cells included in the first memory block array 121 are repaired, and apply the stored first reference data REFD1 to the test data generator 19. In addition, when the activated second test mode signal TM2 for post-test is received, the reference data register 18 may store the second reference data REFD2 set to have the same logic bit set as the second drive data DRD2 generated when no fail cells are included in the second memory block array 123 or when fail cells included in the second memory block array 123 are repaired, and apply the stored second reference data REFD2 to the test data generator 19. The first reference data REFD1 and the second reference data REFD2 may be stored in the reference data register 18 by a mode register set. The first reference data REFD1 and the second reference data REFD2 having different logic bit sets may be stored in the reference data register 18 before the pre-test or post-test is performed.

The test data generator 19 may receive the first drive data DRD1 and the second drive data DRD2 from the input/output control circuit 17. The test data generator 19 may receive the first reference data REFD1 and the second reference data REFD2 from the reference data register 18. The test data generator 19 may generate test data TDQ from the first drive data DRD1, the second drive data DRD2, the first reference data REFD1, and the second reference data REFD2. The test data generator 19 may compare the first drive data DRD1 and the first reference data REFD1, compare the second drive data DRD2 and the second reference data REFD2, and compress comparison results to generate the test data TDQ when pre-test or post-test is performed. The test data TDQ may be set to have a logic bit set that is set according to information of the memory blocks MB including fail cells. Because the test data TDQ is generated by compressing a comparison result between the first drive data DRD1 and the first reference data REFD1 and a comparison result between the second drive data DRD2 and the second reference data REFD2, it may be possible to reduce the test time required to perform pre-test and post-test. The test data TDQ may be applied to an external device of the semiconductor device 1.

FIG. 2 is a block diagram illustrating a configuration of the memory bank 101 and the column line selection circuit 103 included in the semiconductor device 1 shown in FIG. 1.

As illustrated in FIG. 2, the memory bank 101 may include the first memory block array 121, the second memory block array 123, and the redundancy memory block 125. One of the first memory block array 121 and the second memory block array 123 may be selected based on the block array address BRADD. As an example, when the block array address BRADD is set to a logic bit of a logic "low" level, the first memory block array 121 may be selected, and when the block array address BRADD is selected to a logic bit of a logic "high" level, the second memory block array 123 may be selected. Each of the first memory block array 121 and the second memory block array 123 may include a plurality of memory blocks MB. One of the memory blocks MB included in the first memory block array 121 and the second memory block array 123 may be selected based on the block address BADD. As an example, when the block address BADD is set to a $K^{th}$ logic bit set, a $K^{th}$ memory block MB included in each of the first memory block array 121 and the second memory block array 123 may be selected. One of the column lines YL of each of the memory blocks MB may be selected based on the column address CADD. When the column address CADD is set to a $L^{th}$ logic bit set, $L^{th}$ column lines YL of the memory blocks MB may be selected. Here, each of 'K' and 'L' may be set to a natural number. Each memory block MB may include a plurality of memory cells connected to each of the column lines YL. When one of the column lines YL is selected based on the block array address BRADD, the block address BADD, and the column address CADD, at least one memory cell connected to the column line YL may be accessed. The redundancy memory block 125 may include a plurality of redundancy column lines RYL. The redundancy memory block 125 may include a plurality of redundancy cells (not shown) respectively connected to the plurality of redundancy column lines RYL. At least one of the redundancy cells included in the redundancy memory block 125 may be connected to and accessed from one of the redundancy column lines RYL selected when a repair operation is performed based on the redundancy fuse data RFD. In order for the memory cells included in the memory block MB to be accessed or the redundancy cells included to the redundancy memory block 125 to be accessed, one the row lines (e.g., word lines) should be selected based on a row address (not shown) before one of the column lines YL is selected, but a detailed description of the operation of selecting a row line will be omitted for convenience of description. Hereinafter, it is assumed and explained that the row line selection operation is preceded when one of the column lines YL is selected and the memory cells are accessed.

As illustrated in FIG. 2, the column line selection circuit 103 may receive the block array address BRADD, the block address is BADD, the column address CADD, the redundancy fuse data RFD, and the normal fuse data NFD. The column line selection circuit 103 may include a plurality of column decoders CDEC. Each of the plurality of column decoders CDEC may correspond to each of the memory blocks MB and the redundancy memory block 125 included in the first memory block array 121 and the second memory block array 123. When a repair operation is performed based on the redundancy fuse data RFD, the plurality of column decoders CDEC may decode the block array address BRADD, the block address BADD, and the column address CADD to replace at least one of the column lines YL of the selected memory blocks MB with at least one of the redundancy column lines RYL of the redundancy memory block 125. When a repair operation is performed based on the normal fuse data NFD, the plurality of column decoders CDEC may decode the block array address BRADD, the block address BADD, and the column address CADD to replace at least one of the column lines YL of the selected memory blocks MB with another one of the redundancy column lines RYL of the redundancy memory block 125.

Figure 3:
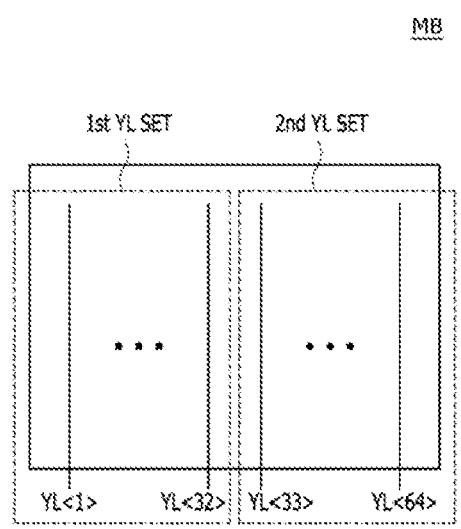
FIG. 3 is a block diagram illustrating a configuration according to an example of a memory block included in the memory bank shown in FIG. 2.
Figure 4:
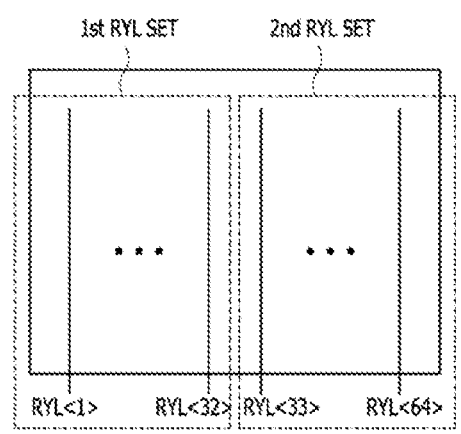
FIG. 4 is a block diagram illustrating a configuration according to an example of a redundancy block included in the memory bank shown in FIG. 2.

FIG. 3 is a block diagram illustrating a configuration according to an example of the memory block MB shown in FIG. 2, and FIG. 4 is a block diagram illustrating a configuration according to an example of the redundancy block 125 shown in FIG. 2.

As illustrated in FIGS. 3 and 4, each memory block MB included in the first memory block array 121 and the second memory block array 123 may include a first column line set (1st YL SET) YL<1:32> and a second column line set (2nd YL SET) YL<33:64>, and the redundancy block 125 may include a first redundancy column line set (1st RYL SET) RYL<1:32> and a second redundancy column line set (2nd RYL SET) RYL<33:64>. The first column line set YL<1:32> may include a first column line YL<1> to a thirty-second column line YL<32>, and the second column line set YL<33:64> may include a thirty-third column line YL<33> to a sixty-fourth column line YL<64>. The first redundancy column line set RYL<1:32> may include a first redundancy column line RYL<1> to a thirty-second redundancy column line RYL<32>, and the second redundancy column line set RYL<33:64> may include a thirty-third redundancy column line RYL<33> to a sixty-fourth redundancy column line RYL<64>.

Figure 5:
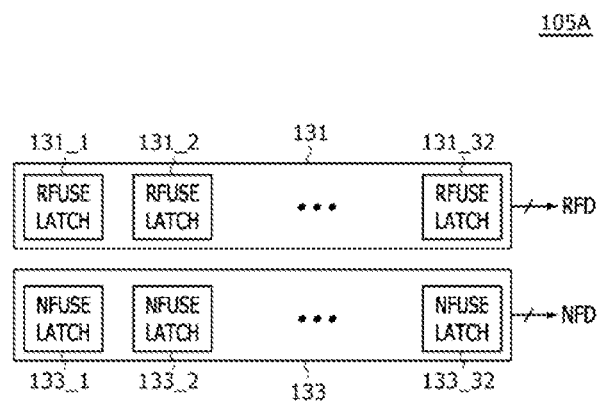
FIG. 5 is a block diagram illustrating a configuration according to an example of a fuse latch circuit included in the semiconductor device shown in FIG. 1.

FIG. 5 is a block diagram illustrating a configuration of a fuse latch circuit 105A according to an example of the fuse latch circuit 105 included in the semiconductor device shown in FIG. 1. As illustrated in FIG. 5, the fuse latch circuit 105A may include a redundancy fuse latch circuit 131 and a normal fuse latch circuit 133. Hereinafter, it is assumed and explained that each of the first memory block array 121 and the second memory block array 123 shown in FIG. 2 includes 16 memory blocks MB, each of the memory blocks MB includes a first column line set YL<1:32> and a second column line set YL<33:64>, as shown in FIGS. 3 and 4, and the redundancy block 125 includes a first redundancy column line set RYL<1:32> and a second redundancy column line set RYL<33:64>.

The redundancy fuse latch circuit 131 may include a plurality of redundancy fuse latches 131_1~131_32 to output redundancy fuse data RFD. As used herein, the tilde "~" indicates a range of components. For example, "131_1~131_32" indicates the redundancy fuse latches 131_1, 131_2, . . . , and 131_32 shown in FIG. 5. Each of the redundancy fuse latches 131_1~131_32 may correspond to the column line YL of each of the memory blocks MB included in the first memory block array 121 and the column line YL of each of the memory blocks MB included in the second memory block array 123. Each of the redundancy fuse latches 131_1~131_32 included in the redundancy fuse latch circuit 131 may store information on the column line YL and information of the memory block MB in which a fail has occurred for a repair operation, and output the stored information as redundancy fuse data RFD. As an example, when a fail occurs in the first column line YL<1> of the first memory block MB included in the first memory block array 121, the first redundancy fuse latch 131_1 may store information on the first memory block MB and the first column line YL<1> included in the first memory block array 121. As another example, when a fail occurs in the third column line YL<3> of the second memory block MB included in the second memory block array 123, the third redundancy fuse latch 131_3 may store information on the second memory block MB and the third column line YL<3> included in the second memory block array 123. Each of the redundancy fuse latches 131_1 to 131_32 may include a plurality of redundancy fuses (not shown), and may set a logic bit set of the redundancy fuse data RFD output from the redundancy fuse latch circuit 131 according to whether the plurality of redundancy fuses are cut. Information on the fail memory block MB and column line YL may be extracted for a repair operation according to the logic bit set of the redundancy fuse data RFD.

As illustrated in FIGS. 5 and 6, the first redundancy fuse latch 131_1 included in the fuse latch circuit 105 may correspond to the first column line YL<1> of each memory block MB included in the first memory block array 121 and the thirty-third column line YL<33> of each memory block MB included in the second memory block array 123. The second redundancy fuse latch 131_2 included in the fuse latch circuit 105 may correspond to the second column line YL<2> of each memory block MB included in the first memory block array 121 and the thirty-fourth column line YL<34> of each memory block MB included in the second memory block array 123. The thirty-second redundancy fuse latch 131_32 included in the fuse latch circuit 105 may correspond to the thirty-second column line YL<32> of each memory block MB included in the first memory block array 121 and the sixty-fourth column line YL<64> of each memory block MB included in the second memory block array 123. Because each of the redundancy fuse latches 131_1 to 131_32 included in the redundancy fuse latch circuit 131 corresponds to the plurality of column lines, the number of redundancy fuse latches 131_1 to 131_32 required for the repair operation may be reduced, and thus, the layout area of the redundancy fuse latch circuit 131 may be reduced.

A repair operation performed based on the redundancy fuse data RFD output from the redundancy fuse latch circuit 131 shown in FIG. 5 will be described as an example. As an example, when a fail occurs in one column line of the first column line set YL<1:32> of the memory block MB included in the first memory block array 121, a repair operation in which one column line of the first column line set YL<1:32> of the memory block MB included in the first memory block array 121 is replaced with one column line of the first redundancy column line set RYL<1:32> of the redundancy block 125 and a repair operation in which one column line of the second column line set YL<33:64> of the memory block MB included in the second memory block array 123 is replaced with one column line of the second redundancy column line set RYL<33:64> of the redundancy block 125 are performed together based on the redundancy fuse data RFD. As another example, when a fail occurs in one column line of the second column line set YL<1:32> of the memory block MB included in the first memory block array 121, a repair operation in which one column line of the second column line set YL<33:64> of the memory block MB included in the first memory block array 121 is replaced with one column line of the first redundancy column line set RYL<1:32> of the redundancy block 125 and a repair operation in which one column line of the first column line set YL<1:32> of the memory block MB included in the second memory block array 123 is replaced with one column line of the second redundancy column line set RYL<33:64> of the redundancy block 125 are performed together based on the redundancy fuse data RFD. As another example, when a fail occurs in one column line of the first column line set YL<1:32> of the memory block MB included in the second memory block array 123, a repair operation in which one column line of the first column line set YL<1:32> of the memory block MB included in the second memory block array 123 is replaced with one column line of the second redundancy column line set RYL<33:64> of the redundancy block 125 and a repair operation in which one column line of the second column line set YL<33:64> of the memory block MB included in the first memory block array 121 is replaced with one column line of the first redundancy column line set RYL<1:32> of the redundancy block 125 are performed together based on the redundancy fuse data RFD. As another example, when a fail occurs in one column line of the second column line set YL<33:64> of the memory block MB included in the second memory block array 123, a repair operation in which one column line of the second column line set YL<33:64> of the memory block MB included in the second memory block array 123 is replaced with one column line of the second column line set RYL<33:64> of the redundancy block 125 and a repair operation in which one column line of the first column line set YL<1:32> of the memory block MB included in the first memory block array 121 is replaced with one column line of the first column line set RYL<1:32> of the redundancy block 125 are performed together based on the redundancy fuse data RFD. Hereinafter, the repair operation performed based on the redundancy fuse data RFD will be described with reference to FIGS. 6 to 11.

Figure 7:
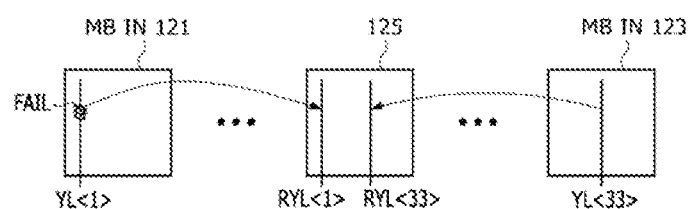

As illustrated in FIGS. 6 and 7, a repair operation in which the first column line YL<1> of the memory block (MB IN 121) included in the first memory block array where a fail has occurred is replaced with the first redundancy column line RYL<1> of the redundancy memory block 125 and a repair operation in which the thirty-third column line YL<33> of the memory block (MB IN 123) included in the second memory block array is replaced with the thirty-third redundancy column line RYL<33> of the redundancy memory block 125 are performed together based on the redundancy fuse data RFD output from the first redundancy fuse latch 131_1. Meanwhile, a repair operation in which the second column line YL<2> of the memory block (MB IN 121) included in the first memory block array where a fail has occurred is replaced with the second redundancy column line RYL<2> of the redundancy memory block 125 and a repair operation in which the thirty-fourth column line YL<34> of the memory block (MB IN 123) included in the second memory block array is replaced with the thirty-fourth redundancy column line RYL<34> of the redundancy memory block 125 are performed together based on the redundancy fuse data RFD output from the second redundancy fuse latch 131_2.

Figure 8:
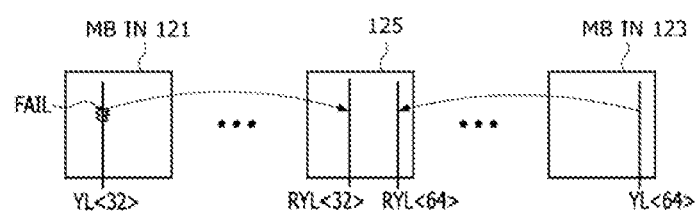

As illustrated in FIGS. 6 and 8, a repair operation in which the thirty-second column line YL<32> of the memory block (MB IN 121) included in the first memory block array where a fail has occurred is replaced with the thirty-second redundancy column line RYL<32> of the redundancy memory block 125 and a repair operation in which the sixty-fourth column line YL<64> of the memory block (MB IN 123) included in the second memory block array is replaced with the sixty-fourth redundancy column line RYL<64> of the redundancy memory block 125 are performed together based on the redundancy fuse data RFD output from the thirty-second redundancy fuse latch 131_32.

As illustrated in FIGS. 5 and 9, the first redundancy fuse latch 131_1 included in the fuse latch circuit 105 may correspond to the thirty-third column line YL<33> of each memory block MB included in the first memory block array 121 and the first column line YL<1> of each memory block MB included in the second memory block array 123. The second redundancy fuse latch 131_2 included in the fuse latch circuit 105 may correspond to the thirty-fourth column line YL<34> of each memory block MB included in the first memory block array 121 and the second column line YL<2> of each memory block MB included in the second memory block array 123. The third-second redundancy fuse latch 131_32 included in the fuse latch circuit 105 may correspond to the sixty-fourth column line YL<64> of each memory block MB included in the first memory block array 121 and the thirty-second column line YL<32> of each memory block MB included in the second memory block array 123.

Figure 10:
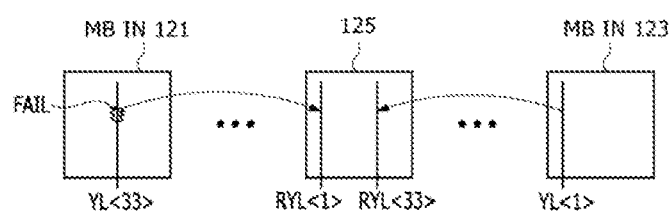

As illustrated in FIGS. 9 and 10, a repair operation in which the thirty-third column line YL<33> of the memory block (MB IN 121) included in the first memory block array where a fail has occurred is replaced with the first redundancy column line RYL<1> of the redundancy memory block 125 and a repair operation in which the first column line YL<1> of the memory block (MB IN 123) included in the second memory block array is replaced with the thirty-third redundancy column line RYL<33> of the redundancy memory block 125 are performed together based on the redundancy fuse data RFD output from the first redundancy fuse latch 131_1. Meanwhile, a repair operation in which the thirty-fourth column line YL<34> of the memory block (MB IN 121) included in the first memory block array where a fail has occurred is replaced with the second redundancy column line RYL<2> of the redundancy memory block 125 and a repair operation in which the second column line YL<2> of the memory block (MB IN 123) included in the second memory block array is replaced with the thirty-fourth redundancy column line RYL<34> of the redundancy memory block 125 are performed together based on the redundancy fuse data RFD output from the second redundancy fuse latch 131_2.

Figure 11:
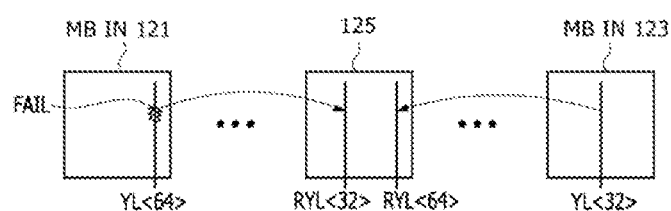

As illustrated in FIGS. 9 and 11, a repair operation in which the sixty-fourth column line YL<64> of the memory block (MB IN 121) included in the first memory block array where a fail has occurred is replaced with the thirty-second redundancy column line RYL<32> of the redundancy memory block 125 and a repair operation in which the thirty-second column line YL<32> of the memory block (MB IN 123) included in the second memory block array is replaced with the sixty-fourth redundancy column line RYL<64> of the redundancy memory block 125 are performed together based on the redundancy fuse data RFD output from the thirty-second redundancy fuse latch 131_32.

As illustrated in FIG. 5, the normal fuse latch circuit 133 may include a plurality of normal fuse latches 133_1~133_32 to output normal fuse data NFD. Each of the normal fuse latches 133_1~133_32 included in the normal fuse latch circuit 133 may correspond to each of the memory blocks MB included in the first memory block array 121 and the second memory block array 123. As an example, when sixteen memory blocks MB are included in each of the first memory block array 121 and the second memory block array 123, the normal fuse latch circuit 133 may include thirty-two normal fuse latches RFUSE LATCH. Here, the first to sixteenth memory blocks MB of the first memory block array 121 may correspond to the first to sixteenth normal fuse latches 133_1~133_16, respectively, and the first to sixteenth memory blocks MB of the second memory block array 123 may correspond to the seventeenth to thirty-second normal fuse latches 133_17~133_32, respectively. The information for replacing one of the column lines YL in which a fail has occurred in the memory blocks MB corresponding to the normal fuse latches 133_1~133_32 with another one of the column lines YL may be stored, and the stored information may be output as the normal fuse data NFD.

Figure 12:
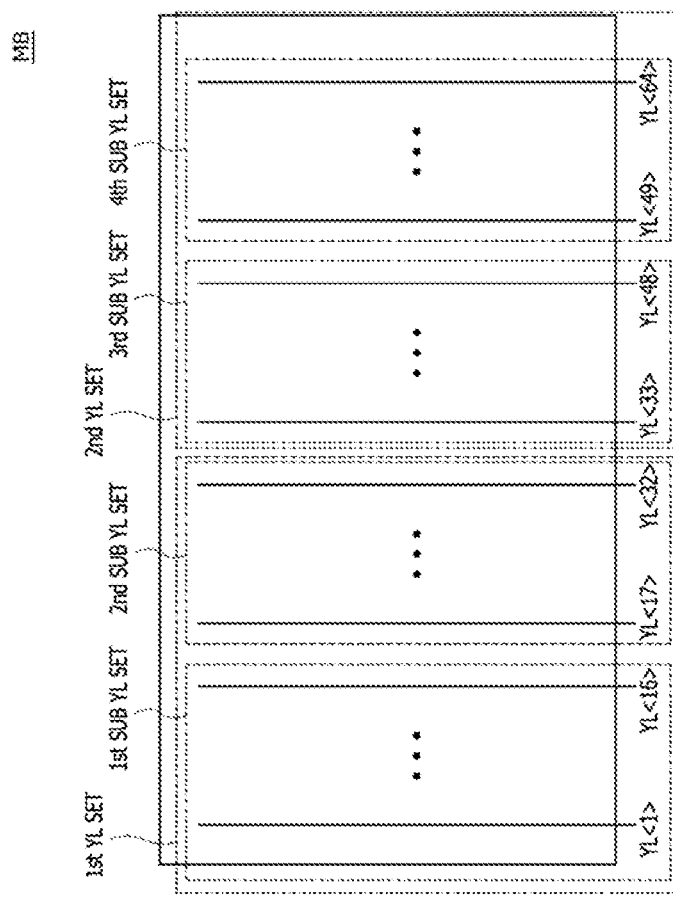

When, as shown in FIG. 12, each of the memory blocks MB included in the first memory block array 121 and the second memory block array 123 includes a first column line set (1st YL set) YL<1:32> and a second column line set (2nd YL SET) YL<33:64>, the first column line set (1st YL set) YL<1:32> is divided into a first sub column line set (1st SUB YL set) YL<1:16> and a second sub column line set (2nd SUB YL set) YL<17:32>, and the second column line set (2nd YL SET) YL<33:64> is divided into a third sub column line set (3rd SUB YL set) YL<33:48> and a fourth sub column line set (4th SUB YL set) YL<49:64>, a repair operation performed based on the normal fuse data NFD output from the redundancy fuse latch circuit 131 will be described as an example. As an example, when a fail occurs in one column line of the first sub-column line set YL<1:16> of the memory block MB, a repair operation may be performed in which the one column line of the first sub-column line set YL<1:16> is replaced with one column line of the second sub-column line set YL<17:32> based on the normal fuse data NFD. As another example, when a fail occurs in one column line of the second sub-column line set YL<17:32> of the memory block MB, a repair operation may be performed in which the one column line of the second sub-column line set YL<17:32> is replaced with one column line of the first sub-column line set YL<1:16> based on the normal fuse data NFD. As another example, when a fail occurs in one column line of the third sub-column line set YL<33:48> of the memory block MB, a repair operation may be performed in which the one column line of the third sub-column line set YL<33:48> is replaced with one column line of the fourth sub-column line set YL<49:64> based on the normal fuse data NFD. As another example, when a fail occurs in one column line of the fourth sub-column line set YL<49:64> of the memory block MB, a repair operation may be performed in which the one column line of the fourth sub-column line set YL<49:64> is replaced with one column line of the third sub-column line set YL<33:48> based on the normal fuse data NFD. Hereinafter, the repair operation performed based on the normal fuse data NFD will be described with reference to FIGS. 13 and 14.

As illustrated in FIG. 13, when a fail occurs in the first column line YL<1> of the memory block MB, a repair operation may be performed in which the first column line YL<1> of the memory block MB is replaced with the seventeenth column line YL<17> of the memory block MB based on the normal fuse data NFD corresponding to the memory block MB. When a fail occurs in the second column line YL<2> of the memory block MB, a repair operation may be performed in which the second column line YL<2> of the memory block MB is replaced with the eighteenth column line YL<18> of the memory block MB based on the normal fuse data NFD corresponding to the memory block MB. When a fail occurs in the sixteenth column line YL<16> of the memory block MB, a repair operation may be performed in which the sixteenth column line YL<16> of the memory block MB is replaced with the thirty-second column line YL<32> of the memory block MB based on the normal fuse data NFD corresponding to the memory block MB. When a fail occurs in the seventeenth column line YL<17> of the memory block MB, a repair operation may be performed in which the seventeenth column line YL<17> of the memory block MB is replaced with the first column line YL<1> of the memory block MB based on the normal fuse data NFD corresponding to the memory block MB. When a fail occurs in the thirty-second column line YL<32> of the memory block MB, a repair operation may be performed in which the thirty-second column line YL<32> of the memory block MB is replaced with the sixteenth column line YL<16> of the memory block MB based on the normal fuse data NFD corresponding to the memory block MB.

As illustrated in FIG. 14, when a fail occurs in the thirty-third column line YL<33> of the memory block MB, a repair operation may be performed in which the thirty-third column line YL<33> of the memory block MB is replaced with the forty-ninth column line YL<49> of the memory block MB based on the normal fuse data NFD corresponding to the memory block MB. When a fail occurs in the thirty-fourth column line YL<34> of the memory block MB, a repair operation may be performed in which the thirty-fourth column line YL<34> of the memory block MB is replaced with the fiftieth column line YL<50> of the memory block MB based on the normal fuse data NFD corresponding to the memory block MB. When a fail occurs in the forty-eighth column line YL<48> of the memory block MB, a repair operation may be performed in which the forty-eighth column line YL<48> of the memory block MB is replaced with the sixty-fourth column line YL<64> of the memory block MB based on the normal fuse data NFD corresponding to the memory block MB. When a fail occurs in the forty-ninth column line YL<49> of the memory block MB, a repair operation may be performed in which the forty-ninth column line YL<49> of the memory block MB is replaced with the thirty-third column line YL<33> of the memory block MB based on the normal fuse data NFD corresponding to the memory block MB. When a fail occurs in the sixty-fourth column line YL<64> of the memory block MB, a repair operation may be performed in which the sixty-fourth column line YL<64> of the memory block MB is replaced with the forty-eighth column line YL<48> of the memory block MB based on the normal fuse data NFD corresponding to the memory block MB.

Figure 15:
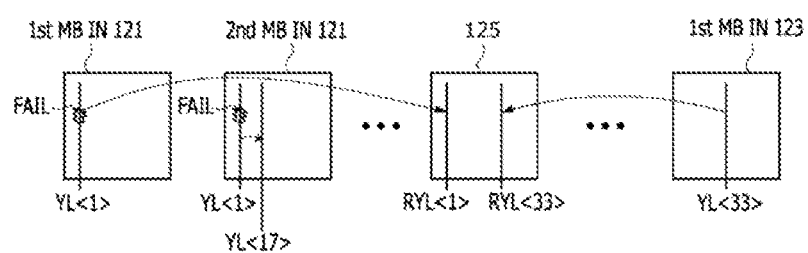
FIG. 15 is a diagram illustrating a repair operation performed based on redundancy fuse data and normal fuse data.

FIG. 15 is a diagram illustrating a repair operation performed based on the redundancy fuse data RFD and the normal fuse data NFD. As illustrated in FIG. 15, when a fail occurs in the first column line YL<1> of the first memory block (1st MB IN 121) included in the first memory block array, a repair operation in which the first column line YL<1> is replaced with the first redundancy column line RYL<1> of the redundancy memory block 125 and a repair operation in which the thirty-third column line YL<33> of the first memory block (1st MB IN 123) included in the second memory block array is replaced with the thirty-third redundancy column line RYL<33> of the redundancy memory block 125 may be performed together based on the redundancy fuse data RFD. Meanwhile, when a fail occurs in the first column line YL<1> of the second memory block (2nd MB IN 121) included in the first memory block array, a repair operation may be performed in which the first column line YL<1> is replaced with the seventeenth column line <YL<17> based on the normal fuse data NFD.

Figure 16:
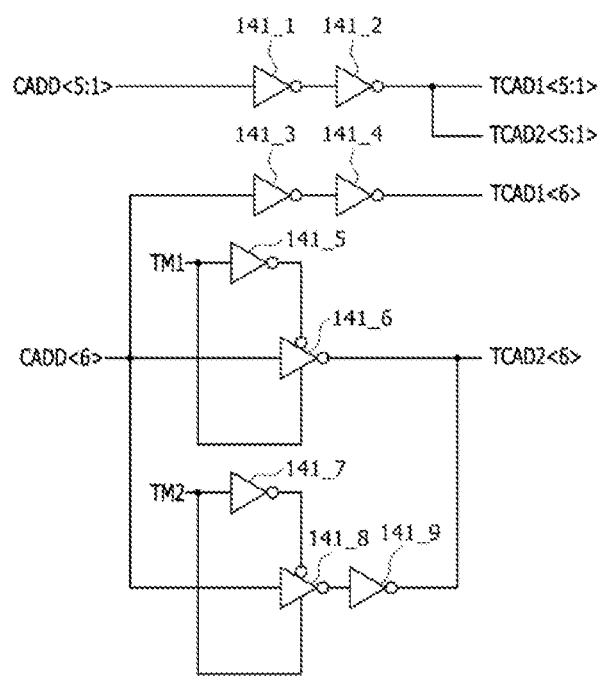
FIG. 16 is a block diagram illustrating a configuration according to an example of a test column address generator included in the semiconductor device shown in FIG. 1.

FIG. 16 is a block diagram illustrating a configuration of a test column address generator 13A according to an example of the test column address generator 13 included in the semiconductor device 1 shown in FIG. 1. As illustrated in FIG. 16, the test column address generator 13A may generate a first test column address TCAD1<6:1> and a second test column address TCAD2<6:1> for performing pre-test or post-test from a column address CADD<6:1>. The test column address generator 13A may include inverters 141_1~141_7. The inverters 141_1 and 141_2 may buffer first to fifth bits CADD<5:1> of the column address to generate first to fifth bits TCAD1<5:1> of the first test column address and first to fifth bits TCAD2<5:1> of the second test column address. The inverters 141_3 and 141_4 may buffer the sixth bit CADD<6> of the column address to generate sixth bit TCAD1<6> of the first test column address. The inverter 141_5 may inversely buffer the first test mode signal TM1 to generate the inversely buffered signal of the first test mode signal TM1. The inverter 141_6 may inversely buffer the sixth bit CADD<6> of the column address to generate sixth bit TCAD2<6> of the second column address when a first test mode signal TM1 of a logic "high" level is received in order to perform pre-test. The inverter 141_7 may inversely buffer the second test mode signal TM2 to generate the inversely buffered signal of the second test mode signal TM2. The inverters 141_8 and 141_9 may buffer the sixth bit CADD<6> of the column address to generate a sixth bit TCAD2<6> of the second column address when the second test mode signal TM2 of a logic "high" level is received in order to perform post-test. In the pre-test, the test column address generator 13A may generate the first test column address TCAD1<6:1> for selecting one of the column lines YL of each of the memory blocks MB included in the first memory block array 121, and may generate the second test column address TCAD2<6:1> for selecting another one of the column lines YL of each of the memory blocks MB included in the second memory block array 123. As an example, in the pre-test, the test column address generator 13A may generate a first test column address TCAD1<6:1> for selecting the first column line YL<1> of each of the memory blocks MB included in the first memory block array 121, and may generate a second test column address TCAD2<6:1> for selecting the thirty-third column line YL<33> of each of the memory blocks MB included in the second memory block array 123. Because the test column address generator 13A generates the first test column address TCAD1<6:1> and the second test column address TCAD2<6:1> so that the column lines on which the repair operations are performed together in the pre-test are selected, it may be possible to check the column lines that are defective and need to be repaired through the pre-test. In post-test, the test column address generator 13A may generate the first test column address TCAD1<6:1> for selecting one of the column lines YL of each of the memory blocks MB included in the first memory block array 121, and may generate the second test column address TCAD2<6:1> for selecting the same one of the column lines YL of each of the memory blocks MB included in the second memory block array 123. As an example, in the post-test, the test column address generator 13A may generate a first test column address TCAD1<6:1> for selecting the first column line YL<1> of each of the memory blocks MB included in the first memory block array 121, and may generate a second test column address TCAD2<6:1> for selecting the first column line YL<1> of each of the memory blocks MB included in the second memory block array 123. Because the test column address generator 13A generates the first test column address TCAD1<6:1> and the second test column address TCAD2<6:1> so that the column lines not repaired together are selected in the post-test, it may be possible to prevent or mitigate a plurality of redundancy column lines RYL repaired together from being selected at the same time and to check whether the repair operation is properly performed through the post-test.

Figure 17:
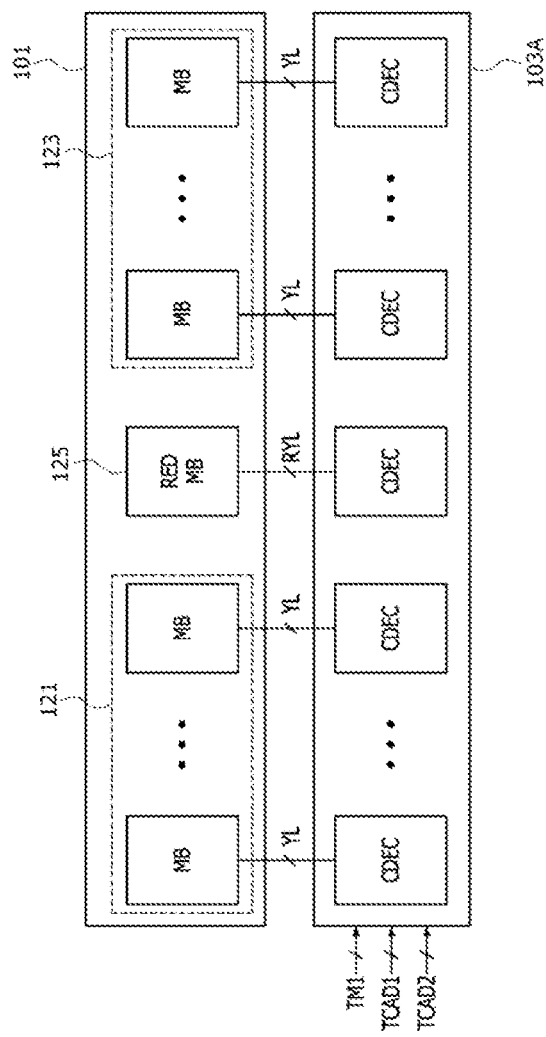
FIGS. 17 and 18 are diagrams for explaining a pre-test operation performed before a repair operation.
Figure 18:
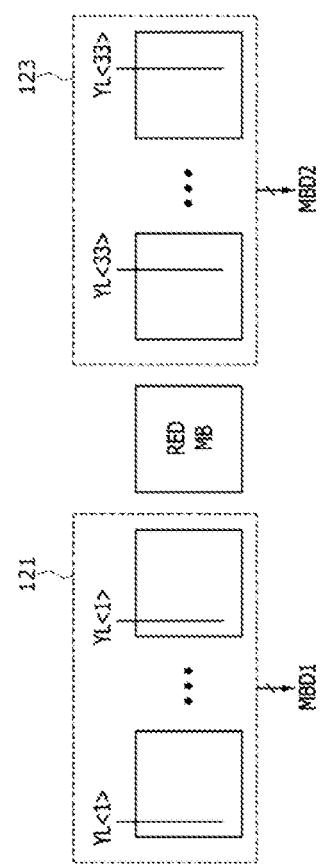

FIGS. 17 and 18 are diagrams for explaining a pre-test operation.

As illustrated in FIG. 17, a memory bank 101 may include a first memory block array 121, a second memory block array 123, and a redundancy memory block 125. Each of the first memory block array 121 and the second memory block array 123 may include a plurality of memory blocks MB.

As illustrated in FIG. 17, a column line selection circuit 103A may receive a first test mode signal TM1, a first test column address TCAD1, and a second test column address TCAD2. The column line selection circuit 103A may include a plurality of column decoders CDEC. When pre-test is performed and the first test mode signal TM1 is received, the column line selection circuit 103A may select one of the column lines YL of each of the memory blocks MB included in the first memory block array 121 and may select another one of the column lines YL of each of the memory blocks MB included in the second memory block array 123 based on the first test column address TCAD1 and the second test column address TCAD2 generated from the column address CADD.

As illustrated in FIG. 18, when a column address CADD for selecting the first column line YL<1> is input in the pre-test, first memory block data MBD1 may be output from the first column lines YL<1> of the memory blocks MB included in the first memory block array 121 by the first test column address TCAD1 generated from the column address CADD. In addition, when the column address CADD for selecting the first column line YL<1> is input, second memory block data MBD2 may be output from the thirty-third column lines YL<33> of the memory blocks MB included in the second memory block array 123 by the second test column address TCAD2 generated from the column address CADD. Thereafter, the column address CADD for selecting the second column line YL<2> to the column address CADD for selecting the sixty-fourth column line YL<64> are sequentially input, and the first memory block data MBD1 and the second test column address TCAD2 may be sequentially generated and output, based on the first test column address TCAD1 and the second test column address TCAD2 generated according to each column address CADD.

Figure 19:
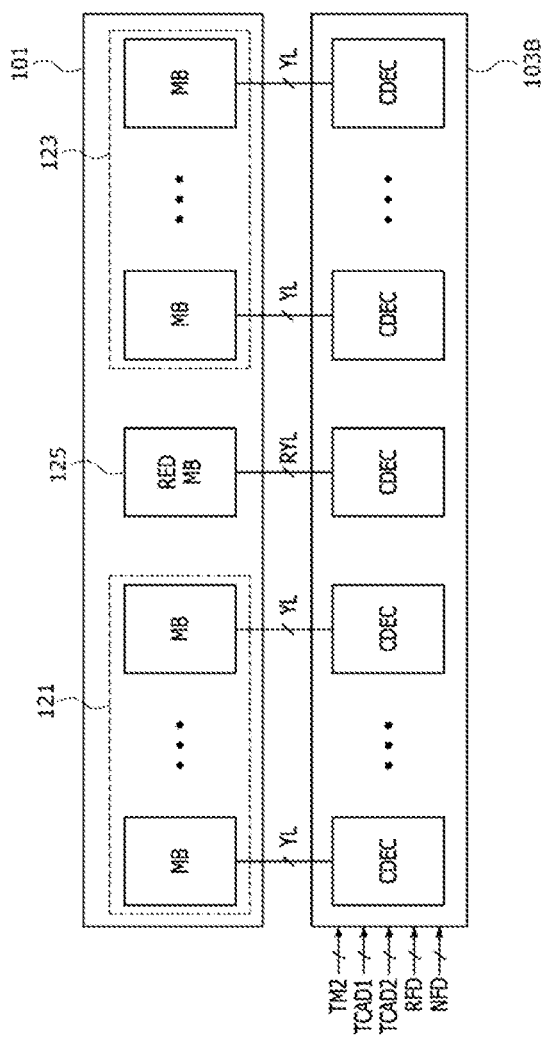
FIGS. 19 and 20 are diagrams for explaining a post-test operation performed after a repair operation.
Figure 20:
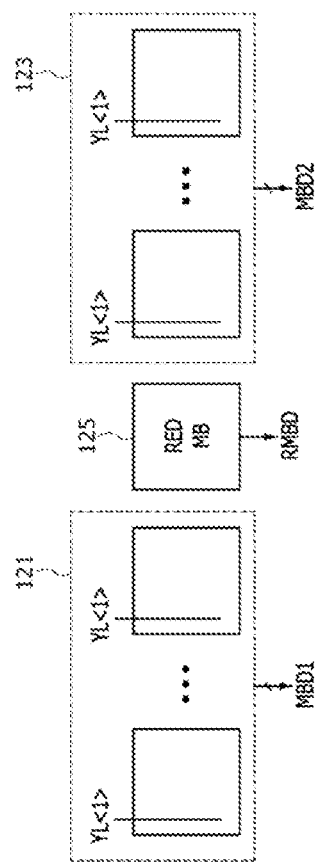

FIGS. 19 and 20 are diagrams illustrating a post-test operation.

As illustrated in FIG. 19, a memory bank 101 may include a first memory block array 121, a second memory block array 123, and a redundancy memory block 125. Each of the first memory block array 121 and the second memory block array 123 may include a plurality of memory blocks MB.

As illustrated in FIG. 19, a column line selection circuit 103B may receive a second test mode signal TM2, a first test column address TCAD1, a second test column address TCAD2, redundancy fuse data RFD, and normal fuse data NFD. The column line selection circuit 103B may include a plurality of column decoders CDEC. When post-test is performed and the second test mode signal TM2 is received, the column line selection circuit 103B may select one of the column lines YL of each of the memory blocks MB included in the first memory block array 121 and may select the same one of the column lines YL of each of the memory blocks MB included in the second memory block array 123, based on the first test column address TCAD1 and the second test column address TCAD2 generated from the column address CADD. The column line selection circuit 103B may select one of the column lines YL of each of the memory blocks MB included in the defective first memory block array 121 by replacing the column line with one of the redundancy column lines RYL of the redundancy block RMB, based on the redundancy fuse data RFD. The column line selection circuit 103B may select one of the column lines YL of each of the memory blocks MB included in the defective second memory block array 123 by replacing the column line with one of the redundancy column lines RYL of the redundancy block RMB, based on the redundancy fuse data RFD. The column line selection circuit 103B may select one of the column lines YL of each of the memory blocks MB included in the defective first memory block array 121 by replacing the column line with another one of the column lines YL of memory blocks MB, based on the normal fuse data NFD. The column line selection circuit 103B may select one of the column lines YL of the memory blocks MB included in the defective second memory block array 123 by replacing the column line with another one of the column lines YL of the memory blocks MB, based on the normal fuse data NFD.

As illustrated in FIG. 20, in the post-test, when a column address CADD for selecting the first column line YL<1> is input, first memory block data MBD1 may be output from the first column lines YL<1> of the memory blocks MB included in the first memory block array 121 by the first test column address TCAD1 generated from the column address CADD. Meanwhile, a fail occurs in one of the first column lines YL<1> of the memory blocks MB included in the first memory block array 121 and the fail column line is replaced with one of the redundancy column lines RYL of the redundancy memory block 125, redundancy memory block data RMBD may be output from the redundancy memory block 125. In addition, when the column address CADD for selecting the first column line YL<1> is input, second memory block data MBD2 may be output from the first column lines YL<1> of the memory blocks MB included in the second memory block array 123 by the second test column address TCAD2 generated from the column address CADD. Meanwhile, a fail occurs in one of the first column lines YL<1> of the memory blocks MB included in the second memory block array 123 and the fail column line is replaced with one of the redundancy column lines RYL of the redundancy memory block 125, redundancy memory block data RMBD may be output from the redundancy memory block 125.

Thereafter, a column address CADD for selecting the second column line YL<2> to a column address CADD for selecting the sixty-fourth column line YL<64> are sequentially input, and the first memory block data MBD1, the second memory block data MBD2, and the redundancy memory block data RMBD may be sequentially generated and output based on the first test column address TCAD1 and the second test column address TCAD2 generated according to each column address CADD.

Figure 21:
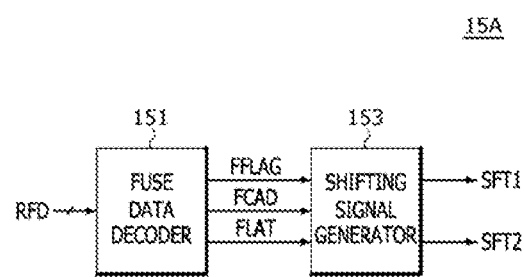
FIG. 21 is a block diagram illustrating a configuration according to an example of a shifting control circuit included in the semiconductor device shown in FIG. 1.

FIG. 21 is a block diagram illustrating a configuration of a shifting control circuit 15A according to an example of the shifting control circuit 15 shown in FIG. 1. As illustrated in FIG. 21, the shifting control circuit 15A may include a fuse data decoder 151 and a shifting signal generator 153.

The fuse data decoder 151 may generate a fuse flag FFLAG, fuse column data FCAD, and a fuse latch signal FLAT based on redundancy fuse data RFD. The fuse flag FFLAG may be activated depending on whether a fail has occurred. For example, the fuse flag FFLAG may be activated to a logic "high" level when a fail occurs in at least one of the memory blocks MB included in the first memory block array 121 or the memory blocks MB included in the second memory block array 123. The fuse column data FCAD may include information on a column line set of the memory block MB in which the fail has occurred. For example, the fuse column data FCAD may be set to a logic "low" level when a fail occurs in the first column line set (1st YL SET) of the memory block MB, and may be set to a logic "high" level when a fail occurs in the second column line set (2nd YL SET) of the memory block MB. The fuse latch signal FLAT may include information on the memory blocks MB that are repaired together. As an example, the fuse latch signal FLAT may be set to a logic "low" level when the first column line set (1st YL SET) of the memory block MB included in the first memory block array 121 and the second column line set (2nd YL SET) of the memory block MB included in the second memory block array 123 are repaired together, and may be set to a logic "high" level when the second column line set (2nd YL SET) of the memory block MB included in the first memory block array 121 and the first column line set (1st YL SET) of the memory block MB included in the second memory block array 123 are repaired together.

The shifting signal generator 153 may generate a first shifting signal SFT1 and a second shifting signal SFT2 based on the fuse flag FFLAG, the fuse column data FCAD, and the fuse latch signal FLAT. The shifting signal generator 153 may generate the first shifting signal SFT1 activated to a logic "high" level when a fail in the memory block MB included in the first memory block array 121 is repaired. As an example, the shifting signal generator 153 may receive the fuse flag FFLAG activated to a logic "high" level, the fuse column data FCAD of a logic "low" level, and the fuse latch signal FLAT of a logic "low" level to generate the first shifting signal SFT1 activated to a logic "high" level when a fail occurs in the first column line set (1st YL SET) of the memory block MB included in the first memory block array 121 and the first column line set (1st YL SET) of the memory block MB included in the first memory block array 121 and the second column line set (2nd YL SET) of the memory block MB included in the second memory block array 123 are repaired together. As another example, the shifting signal generator 153 may receive the fuse flag FFLAG activated to a logic "high" level, the fuse column data FCAD of a logic "high" level, and the fuse latch signal FLAT of a logic "high" level to generate the first shifting signal SFT1 activated to a logic "high" level when a fail occurs in the second column line set (2nd YL SET) of the memory block MB included in the first memory block array 121 and the second column line set (2nd YL SET) of the memory block MB included in the first memory block array 121 and the first column line set (1st YL SET) of the memory block MB included in the second memory block array 123 are repaired together.

The shifting signal generator 153 may generate a second shifting signal SFT2 activated to a logic "high" level when a fail in the memory block MB included in the second memory block array 123 is repaired. As an example, the shifting signal generator 153 may receive the fuse flag FFLAG activated to a logic "high" level, the fuse column data FCAD of a logic "low" level, and the fuse latch signal FLAT of a logic "high" level to generate the second shifting signal SFT2 activated to a logic "high" level when a fail occurs in the first column line set (1st YL SET) of the memory block MB included in the second memory block array 123, and the first column line set (1st YL SET) of the memory block MB included in the second memory block array 123 and the second column line set (2nd YL SET) of the memory block MB included in the first memory block array 121 are repaired together. As another example, the shifting signal generator 153 may receive the fuse flag FFLAG activated to a logic "high" level, the fuse column data FCAD of a logic "high" level, and the fuse latch signal FLAT of a logic "low" level to generate the second shifting signal SFT2 activated to a logic "high" level when a fail occurs in the second column line set (2nd YL SET) of the memory block MB included in the second memory block array 123 and the second column line set (2nd YL SET) of the memory block MB included in the second memory block array 123 and the first column line set (1st YL SET) of the memory block MB included in the first memory block array 121 are repaired together.

Figure 22:
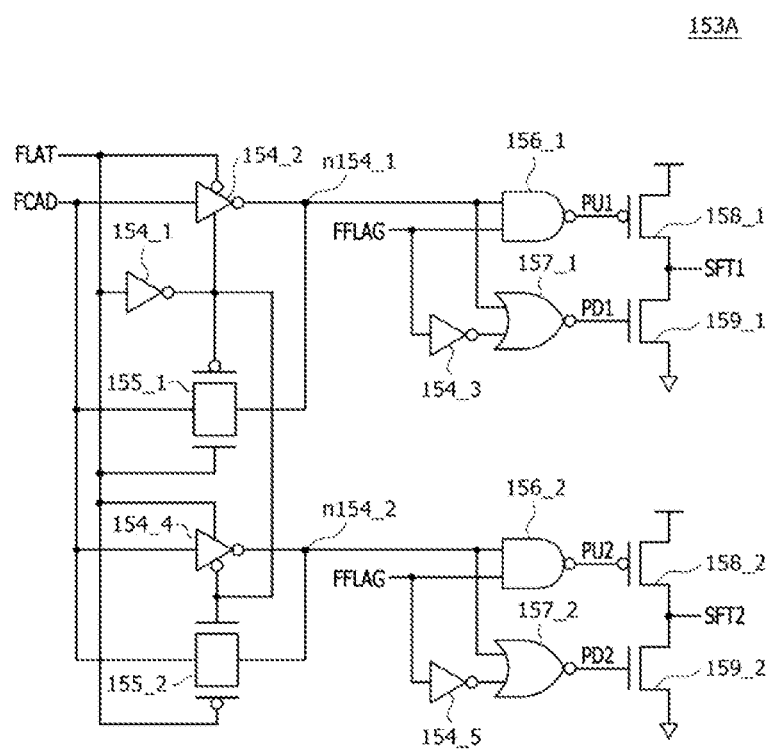
FIG. 22 is a circuit diagram according to an example of a shifting signal generator included in the shifting control circuit shown in FIG. 21.

FIG. 22 is a circuit diagram illustrating a configuration of a shifting signal generator 153A according to an example of the shifting signal generator 153 shown in FIG. 21.

As illustrated in FIG. 22, the shifting signal generator 153A may include inverters 154_1~154_5, transmission gates 155_1 and 155_2, NAND gates 156_1 and 156_2, NOR gates 157_1 and 157_2, PMOS transistors 158_1 and 158_2, and NMOS transistors 159_1 and 159_2. The inverter 154_1 may inversely buffer the fuse latch signal FLAT to output an inversely buffered signal of the fuse latch signal FLAT. The inverter 154_2 may inversely buffer the fuse column data FCAD to output an inversely buffered signal of the fuse column data FCAD to a node n154_1 when the fuse latch signal FLAT is at a logic "low" level. The inverter 154_3 may inversely buffer the fuse flag FFLAG to output an inversely buffered signal of the fuse flag FFLAG. The inverter 154_4 may inversely buffer the fuse column data FCAD to output an inversely buffered signal of the fuse column data FCAD to a node n154_2 when the fuse latch signal FLAT is at a logic "high" level. The inverter 154_5 may inversely buffer the fuse flag FFLAG to output an inversely buffered signal of the fuse flag FFLAG. The transmission gate 155_1 may output the fuse column data FCAD to the node n154_1 when the fuse latch signal FLAT is at a logic "high" level. The transmission gate 155_2 may output the fuse column data FCAD to the node n154_2 when the fuse latch signal FLAT is at a logic "low" level. The NAND gate 156_1 may perform a logical NAND operation on a signal of the node n154_1 and the fuse flag FFLAG to generate a first pull-up signal PU1. The NAND gate 156_2 may perform a logical NAND operation on a signal of the node n154_2 and the fuse flag FFLAG to generate a second pull-up signal PU2. The NOR gate 157_1 may perform a logical NOR operation on a signal of the node n154_1 and an output signal of the inverter 154_3 to generate a first pull-down signal PD1. The NOR gate 157_2 may perform a logical NOR operation on a signal of the node n154_2 and an output signal of the inverter 154_5 to generate a second pull-down signal PD2. The PMOS transistor 158_1 may receive the first pull-up signal PU1 activated to a logic "high" level to drive the first shifting signal SFT1 to a logic "high" level. The PMOS transistor 158_2 may receive the second pull-up signal PU2 activated to a logic "low" level to drive the second shifting signal SFT2 to a logic "high" level. The NMOS transistor 159_1 may receive the first pull-down signal PD1 activated to a logic "high" level to drive the first shifting signal SFT1 to a logic "low" level. The NMOS transistor 159_2 may receive the second pull-down signal PD2 activated to a logic "high" level to drive the second shifting signal SFT2 to a logic "low" level.

Figure 23:
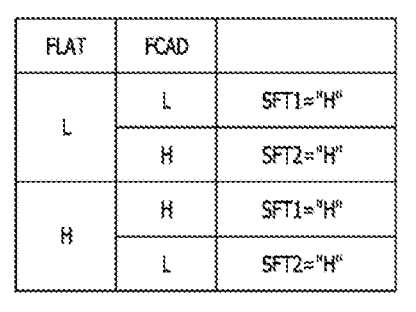

The operation of the shifting signal generator 153A will be described with reference to FIGS. 22 and 23.

When a fail occurs in the first column line set (1st YL SET) of the memory block MB included in the first memory block array 121 and the first column line set (1st YL SET) of the memory block MB included in the first memory block array 121 and the second column line set (2nd YL SET) of the memory block MB included in the second memory block array 123 are repaired together, a fuse flag FFLAG activated to a logic "high" level and a fuse latch signal FLAT and fuse column data FCAD both set to a logic "low" level are generated. When both the fuse latch signal FLAT and the fuse column data FCAD are set to a logic "low" level, the inverter 154_2 sets the node n154_1 to a logic "high" level, and the transmission gate 155_2 sets the node n154_2 to a logic "low" level. According to the node n154_1 set to a logic "high" level, the NAND gate 156_1 generates a first pull-up signal PU1 activated to a logic "low" level, and the NOR gate 157_1 generates a first pull-down signal PD1 deactivated to a logic "low" level. A first shifting signal SFT1 activated to a logic "high" level is generated by the PMOS transistor 158_1 turned on by the first pull-up signal PU1 activated to a logic "low" level.

When a fail occurs in the second column line set (2nd YL SET) of the memory block MB included in the second memory block array 123 and the second column line set (2nd YL SET) of the memory block MB included in the second memory block array 123 and the first column line set (1st YL SET) of the memory block MB included in the first memory block array 121 are repaired together, a fuse flag FFLAG activated to a logic "high" level, a fuse latch signal FLAT of a logic "low" level, and fuse column data FCAD of a logic "high" level are generated. When the fuse latch signal FLAT is set to a logic "low" level and the fuse column data FCAD is set to a logic "low" level, the inverter 154_2 sets the node n154_1 to a logic "low" level, and the transmission gate 155_2 sets the node n154_2 to a logic "high" level. According to the node n154_2 set to a logic "high" level, the NAND gate 156_2 generates a second pull-up signal PU2 activated to a logic "low" level, and the NOR gate 157_2 generates a second pull-down signal PD2 deactivated to a logic "low" level. A second shifting signal SFT2 activated to a logic "high" level is generated by the PMOS transistor 158_2 turned on by the second pull-up signal PU2 activated to a logic "low" level.

When a fail occurs in the second column line set (2nd YL SET) of the memory block MB included in the first memory block array 121 and the second column line set (2nd YL SET) of the memory block MB included in the first memory block array 121 and the first column line set (1st YL SET) of the memory block MB included in the second memory block array 123 are repaired together, a fuse flag FFLAG activated to a logic "high" level and both the fuse latch signal FLAT and fuse column data FCAD set to a logic "high" level are generated. When both the fuse latch signal FLAT and the column data FCAD are set to a logic "high" level, the transmission gate 155_1 sets the node n154_1 to a logic "high" level, and the inverter 154_4 sets the node n154_2 to a logic "high" level. According to the node n154_1 set to a logic "high" level, the NAND gate 156_1 generates a first pull-up signal PU1 activated to a logic "low" level, and the NOR gate 157_1 generates a first pull-down signal PD1 deactivated to a logic "low" level. A first shifting signal SFT1 activated to a logic "high" level is generated by the PMOS transistor 158_1 turned on by the first pull-up signal PU1 activated to a logic "low" level.

When a fail occurs in the first column line set (1st YL SET) of the memory block MB included in the first memory block array 123 and the first column line set (1st YL SET) of the memory block MB included in the second memory block array 123 and the second column line set (2nd YL SET) of the memory block MB included in the first memory block array 121 are repaired together, a fuse flag FFLAG activated to a logic "high" level, a fuse latch signal FLAT of a logic "high" level, and fuse column data FCAD of a logic "low" level are generated. When the fuse latch signal FLAT is set to a logic "high" level and the fuse column data FCAD is set to a logic "low" level, the transmission gate 155_1 sets the node n154_1 to a logic "low" level, and the inverter 154_4 sets the node n154_2 to a logic "high" level. According to the node n154_2 set to a logic "high" level, the NAND gate 156_2 generates a second pull-up signal PU2 activated to a logic "low" level, and the NOR gate 157_2 generates a second pull-down signal PD2 deactivated to a logic "low" level. A second shifting signal SFT2 activated to a logic "high" level is generated by the PMOS transistor 158_2 turned on by the second pull-up signal PU2 activated to a logic "low" level.

Figure 24:
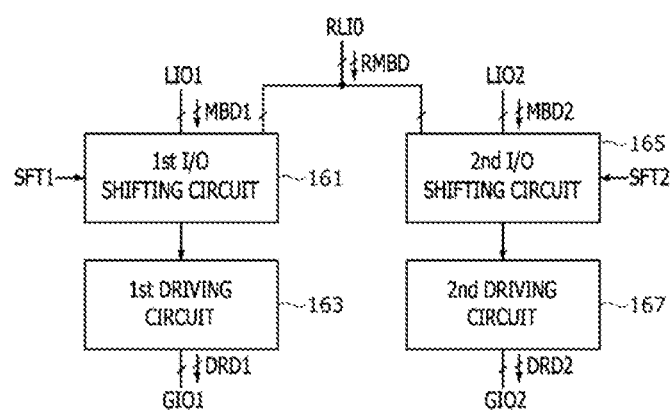
FIG. 24 is a block diagram illustrating a configuration according to an example of an input/output control circuit included in the semiconductor device shown in FIG. 1.

FIG. 24 is a block diagram illustrating a configuration of an input/output control circuit 17A according to an example of the input/output control circuit 17 shown in FIG. 1. As illustrated in FIG. 24, the input/output control circuit 17A may include a first input/output shifting circuit 161, a first driving circuit 163, a second input/output shifting circuit 165, and a second driving circuit 167.

The first input/output shifting circuit 161 may output first memory block data MBD1 received through a first local line LIO1 to the first driving circuit 163 based on a first shifting signal SFT1, or may shift a portion of the first memory block data MBD1 and redundancy memory block data RMBD received through a redundancy local line RLIO to output the shifted data to the first driving circuit 163. As an example, the first input/output shifting circuit 161 receiving the first shifting signal SFT1 that is activated to a logic "high" level when a fail of the memory block MB included in the first memory block 121 is repaired may sequentially shift a portion of the first memory block data MBD1 and the redundancy memory block data RMBD to output the shifted data to the first driving circuit 163. As another example, the first input/output shifting circuit 161 receiving the first shifting signal SFT1 that is deactivated when the memory block MB included in the first memory block array 121 does not include a fail may output the first memory block data MBD1 to the first driving circuit 163.

The first driving circuit 163 may drive first drive data DRD1 based on a signal received from the first input/output shifting circuit 161. As an example, when a fail of the memory block MB included in the first memory block array 121 is repaired so that the sequentially shifted portion of the first memory block data MBD1 and the redundancy memory block data RMBD are output from the first input/output shifting circuit 161, the first driving circuit 163 may drive the first drive data DRD1 based on the shifted and received portion of the first memory block data MBD1 and the redundancy memory block data RMBD. As another example, when the memory block MB included in the first memory block array 121 does not include a fail and the first memory block data MBD1 is output from the first input/output shifting circuit 161, the first driving circuit 163 may drive the first drive data DRD1 based on the received first memory block data MBD1.

The second input/output shifting circuit 165 may output second memory block data MBD2 received through a second local line LIO2 to the second driving circuit 167 based on a second shifting signal SFT2, or may shift a portion of the second memory block data MBD2 and redundancy memory block data RMBD received through the redundancy local line RLIO to output the shifted data to the second driving circuit 167. As an example, the second input/output shifting circuit 165 receiving the second shifting signal SFT2 that is activated to a logic "high" level when a fail of the memory block MB included in the second memory block 123 is repaired may sequentially shift a portion of the second memory block data MBD2 and the redundancy memory block data RMBD to output the shifted data to the second driving circuit 167. As another example, the second input/output shifting circuit 165 receiving the second shifting signal SFT2 deactivated when the memory block MB included in the second memory block array 123 does not include a fail may output the second memory block data MBD2 to the second driving circuit 167.

The second driving circuit 167 may drive the second drive data DRD2 based on a signal received from the second input/output shifting circuit 165. As an example, when a fail of the memory block MB included in the second memory block array 123 is repaired so that the sequentially shifted portion of the second memory block data MBD2 and the redundancy memory block data RMBD are output from the second input/output shifting circuit 165, the second driving circuit 167 may drive the second drive data DRD2 based on the shifted and received portion of the second memory block data MBD2 and the redundancy memory block data RMBD. As another example, when a fail is not included in the memory block MB included in the second memory block array 123 so that the second memory block data MBD2 is output from the second input/output shifting circuit 165, the second driving circuit 167 may drive the second drive data DRD2 based on the received second memory block data MBD2.

Figure 25:
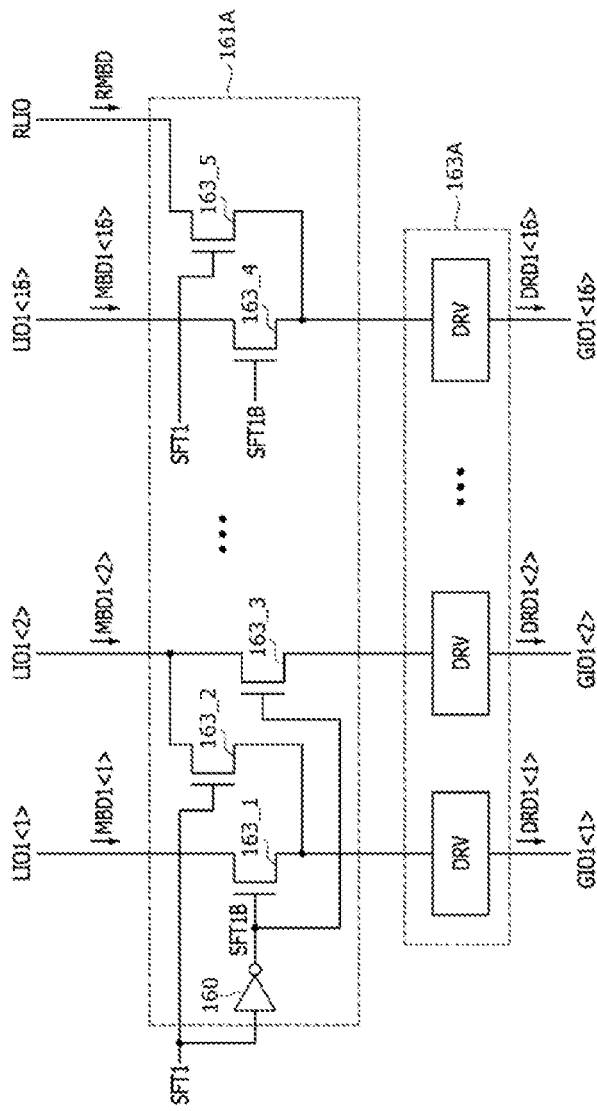
FIG. 25 is a diagram illustrating a configuration according to an example of a first input/output shifting circuit and a first driving circuit shown in FIG. 24.

FIG. 25 is a diagram illustrating configurations of a first input/output shifting circuit 161A and a first driving circuit 163A according to examples of the first input/output shifting circuit 161 and the first driving circuit 163 shown in FIG. 24, respectively.

As illustrated in FIG. 25, the first input/output shifting circuit 161A may include an inverter 160 and MOS transistors 163_1~163_5. The inverter 160 may inversely buffer the first shifting signal SFT1 to generate a first inverted shifting signal SFT1B. The NMOS transistors 163_1, 163_3, and 163_4 may be turned on by receiving the first inverted shifting signal SFT1B set to a logic "high" level when the first shifting signal SFT1 is deactivated to a logic "low" level. When the NMOS transistor 163_1 is turned on, a first bit MBD1<1> of the first memory block data received through a first line LIO1<1> of the first local line may be output to a first driver DRV of the first driving circuit 163A. When the NMOS transistor 163_3 is turned on, a second bit MBD1<2> of the first memory block data received through a second line LIO1<2> of the first local line may be output to a second driver DRV of the first driving circuit 163A. When the NMOS transistor 163_4 is turned on, a sixteenth bit MBD1<16> of the first memory block data received through a sixteenth line LIO1<16> of the first local line may be output to a sixteenth driver DRV of the first driving circuit 163A. The NMOS transistors 163_2 and 163_5 may be turned on when the first shifting signal SFT1 is activated. When the NMOS transistor 163_2 is turned on, a second bit MBD1<2> of the first memory block data received through a second line LIO1<2> of the first local line may be output to the first driver DRV of the first driving circuit 163A. When the NMOS transistor 163_5 is turned on, the redundancy memory block data RMBD received through a redundancy local line RLIO may be output to the sixteenth driver DRV of the first driving circuit 163A. The first input/output shifting circuit 161A may shift the second to sixteenth bits MBD1<2:16> of the first memory block data and the redundancy memory block data RMBD to output the shifted bits and data to the first driving circuit 163A through the NMOS transistors 163_2 and 163_5 that are turned on when the first shifting signal SFT1 is activated. The first input/output shifting circuit 161A may output the first to sixteenth bits MBD1<1:16> of the first memory block data to the first driving circuit 163A through the NMOS transistors 163_1, 163_3, and 163_4 that are turned on when the first shifting signal SFT1 is deactivated.

As illustrated in FIG. 25, the first driving circuit 163A may include a plurality of drivers DRV. Each of the plurality of drivers DRV included in the first driving circuit 163A may drive the first to sixteenth bits DRD1<1:16> of the first drive data, based on a signal received from the first input/output shifting circuit 161A. The first driving circuit 163A may drive the first to sixteenth bits DRD1<1:16> of the first drive data, based on the second to sixteenth bits MBD1<2:16> of the first memory block data and the redundancy memory block data RMBD that are shifted and received when the first shifting signal SFT1 is activated. The first driving circuit 163A may drive the first to sixteenth bits DRD1<1:16> of the first drive data, based on the first to sixteenth bits MBD1<1:16> of the first memory block data received when the first shifting signal SFT1 is deactivated.

Figure 26:
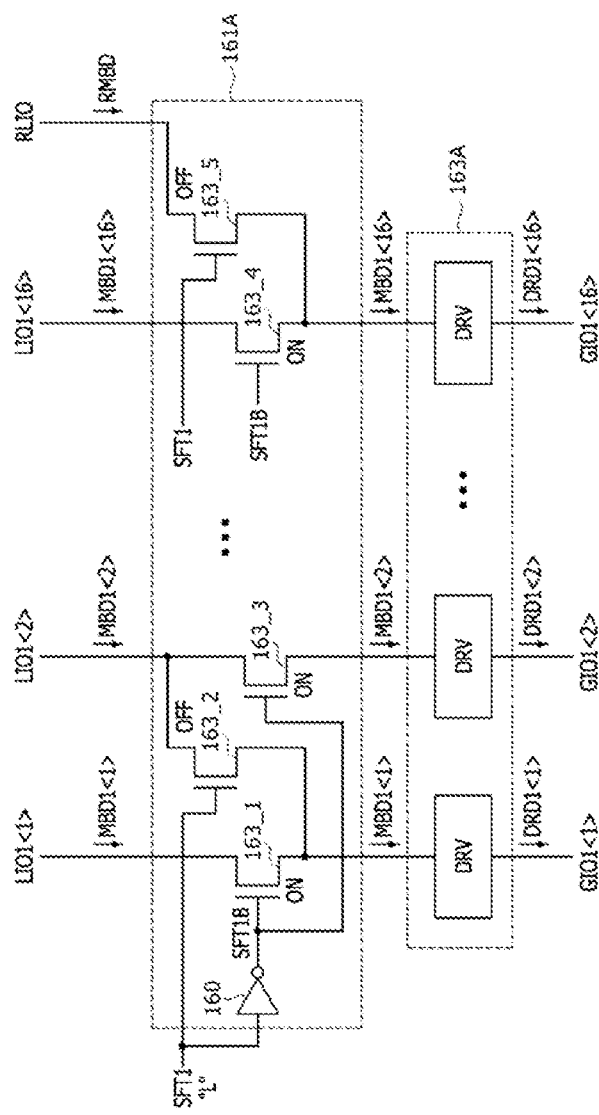
FIGS. 26 and 27 are diagrams for explaining a shifting operation performed based on a first shifting signal in FIG. 25.
Figure 27:
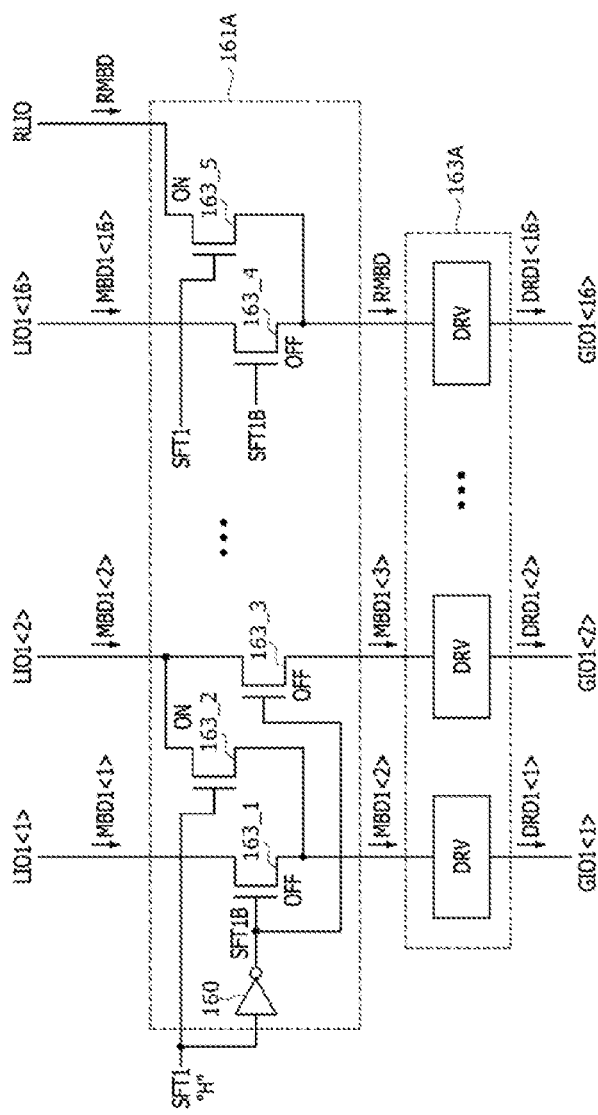

FIGS. 26 and 27 are diagrams illustrating a shifting operation performed by the first shifting signal SFT1 shown in FIG. 25.

As illustrated in FIG. 26, when the first shifting signal SFT1 is deactivated to a logic "low" level, the NMOS transistors 163_1, 163_3, and 163_4 are turned on and the NMOS transistors 163_2 and 163_5 are turned off, so that the first input/output shifting circuit 161A may output the first to sixteenth bits MBD1<1:16> of the first memory block data to the first driving circuit 163A. The first driving circuit 163A may drive the first to sixteenth bits DRD1<1:16> of the first drive data, based on the received first to sixteenth bits MBD1<1:16> of the first memory block data.

As illustrated in FIG. 27, when the first shifting signal SFT1 is activated to a logic "high" level, the NMOS transistors 163_1, 163_3, and 163_4 are turned off and the NMOS transistors 163_2 and 163_5 are turned on, so that the first input/output shifting circuit 161A may shift the first to sixteenth bits MBD1<1:16> of the first memory block data and the redundancy memory block data RMBD to output the shifted bits and data to the first driving circuit 163A. The first driving circuit 163A may drive the first to sixteenth bits DRD1<1:16> of the first drive data, based on the shifted and received first to sixteenth bits MBD1<1:16> of the first memory block data and the redundancy memory block data RMBD.

Figure 28:
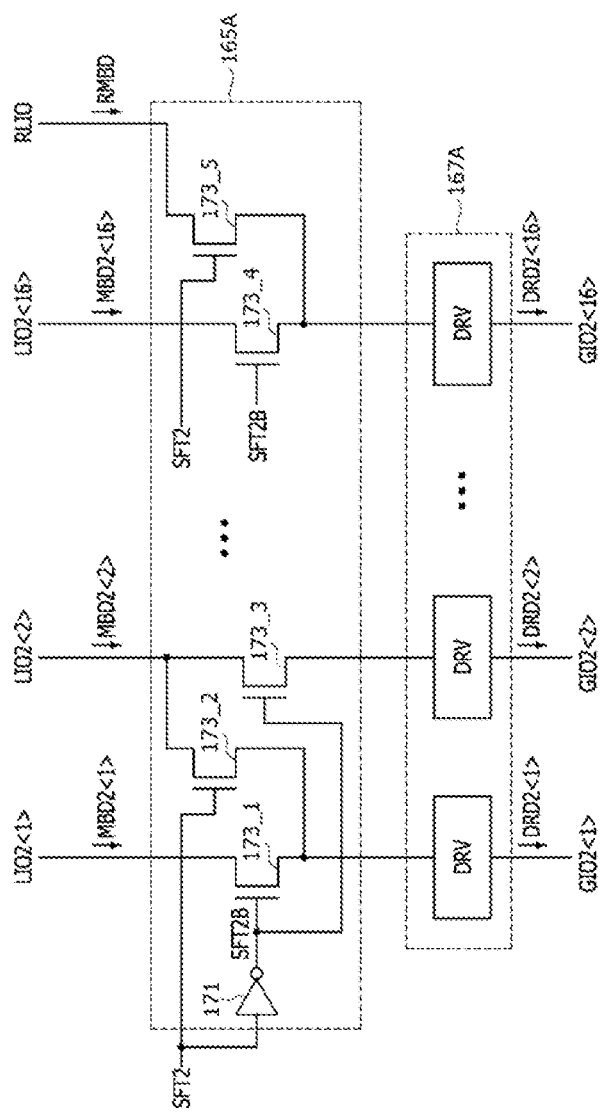
FIG. 28 is a diagram illustrating a configuration according to an example of a second input/output shifting circuit and a second driving circuit shown in FIG. 24.

FIG. 28 is a diagram illustrating a configuration of a second input/output shifting circuit 165A and a second driving circuit 167A according to examples of the second input/output shifting circuit 165 and the second driving circuit 167 shown in FIG. 24, respectively.

As illustrated in FIG. 28, the second input/output shifting circuit 165A may include an inverter 171 and NMOS transistors 173_1~173_5. The inverter 171 may inversely buffer the second shifting signal SFT2 to generate a second inverted shifting signal SFT2B. The NMOS transistors 173_1, 173_3, and 173_4 may receive the second inverted shifting signal SFT2B set to a logic "high" level when the second shifting signal SFT2 is deactivated to a logic "low" level to be turned on. The second input/output shifting circuit 165A may output the first bit MBD2<1> of the second memory block data received through the first line LIO2<1> of the second local line to the first driver DRV of the second driving circuit 167A when the NMOS transistor 173_1 is turned on. The second input/output shifting circuit 165A may output a second bit MBD2<2> of the second memory block data received through the second line LIO2<2> of the second local line to the second driver DRV of the second driving circuit 167A when the NMOS transistor 173_3 is turned on. The second input/output shifting circuit 165A may output a sixteenth bit MBD2<16> of the second memory block data received through the sixteenth line LIO2<16> of the second local line to the sixteenth driver DRV of the second driving circuit 167A when the NMOS transistor 173_4 is turned on. The NMOS transistors 173_2 and 173_5 may be turned on when the second shifting signal SFT2 is activated. The second input/output shifting circuit 165A may output the second bit MBD2<2> of the second memory block data received through the second line LIO2<2> of the second local line to the first driver DRV of the second driving circuit 167A when the NMOS transistor 173_2 is turned on. The second input/output shifting circuit 165A may output a redundancy memory block data RMBD received through a redundancy local line RLIO to the sixteenth driver DRV of the second driving circuit 167A when the NMOS transistor 173_5 is turned on. The second input/output shifting circuit 165A may shift the second to sixteenth bits MBD2<2:16> of the second memory block data and the redundancy memory block data RMBD to output the shifted bits and data to the second driving circuit 167A through the NMOS transistors 173_2 and 173_5 that are turned on when the second shifting signal SFT2 is activated. The second input/output shifting circuit 165A may output the first to sixteenth bits MBD2<1:16> of the second memory block data to the second driving circuit 167A through the NMOS transistors 173_1, 173_3, and 173_4 that are turned on when the second shifting signal SFT2 is deactivated.

As illustrated in FIG. 28, the second driving circuit 167A may include the plurality of drivers DRV. Each of the plurality of drivers DRV included in the second driving circuit 167A may drive the first to sixteenth bits DRD2<1:16> of the second drive data, based on the signal received from the second input/output shifting circuit 165A. The second driving circuit 167A may drive the first to sixteenth bits DRD2<1:16> of the second drive data, based on the shifted and received second to sixteenth bits MBD2<2:16> of the second memory block data and the redundancy memory block data RMBD when the second shifting signal SFT2 is activated. The second driving circuit 167A may drive the first to sixteenth bits DRD2<1:16> of the second drive data, based on the received first to sixteenth bits MBD2<1:16> of the second memory block data when the second shifting signal SFT2 is deactivated.

Figure 29:
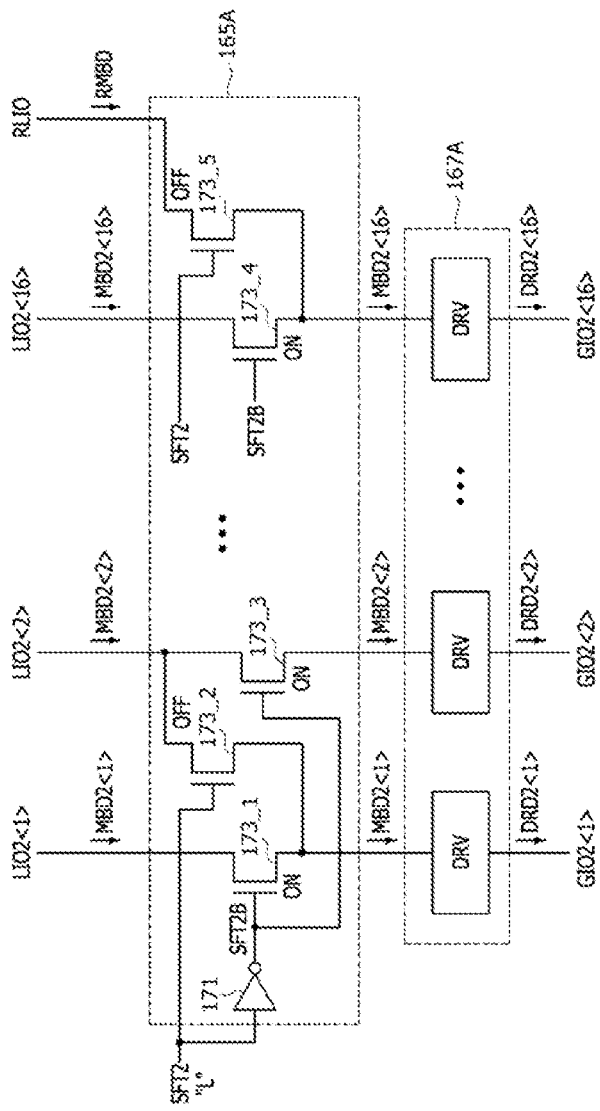
FIGS. 29 and 30 are diagrams for explaining a shifting operation performed based on a second shifting signal in FIG. 28.
Figure 30:
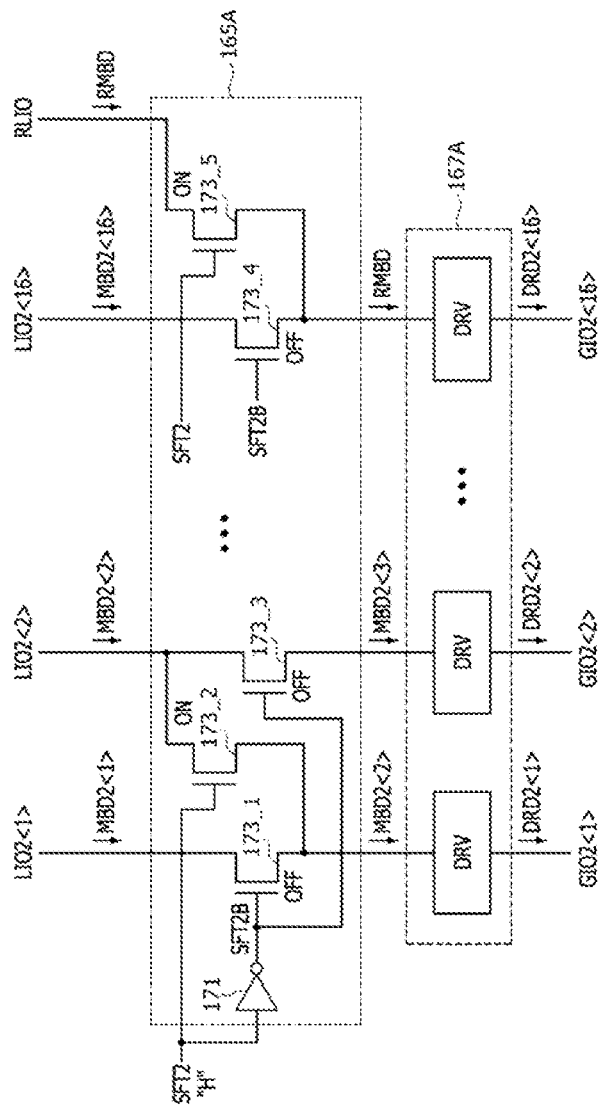

FIGS. 29 and 30 are diagrams illustrating a shifting operation performed by the second shifting signal SFT2 in FIG. 28.

As illustrated in FIG. 29, when the second shifting signal SFT2 is deactivated to a logic "low" level, the NMOS transistors 173_1, 173_3, and 173_4 are turned on and the NMOS transistors 173_2 and 173_5 are turned off, so that the second input/output shifting circuit 165A may output the first to sixteenth bits MBD2<1:16> of the second memory block data to the second driving circuit 167A. The second driving circuit 167A may drive the first to sixteenth bits DRD2<1:16> of the second drive data, based on the received first to sixteenth bits MBD2<1:16> of the second memory block data.

As illustrated in FIG. 30, when the second shifting signal SFT2 is activated to a logic "high" level, the NMOS transistors 173_1, 173_3, and 173_4 are turned off and the NMOS transistors 173_2 and 173_5 are turned on, so that the second input/output shifting circuit 165A may shift the second to sixteenth bits MBD2<2:16> of the second memory block data and the redundancy memory block data RMBD to output the shifted bits and data to the second driving circuit 167A. The second driving circuit 167A may drive the first to sixteenth bits DRD2<1:16> of the second drive data, based on the shifted and received second to sixteenth bits MBD2<2:16> of the second memory block data and the redundancy memory block data RMBD.

Figure 31:
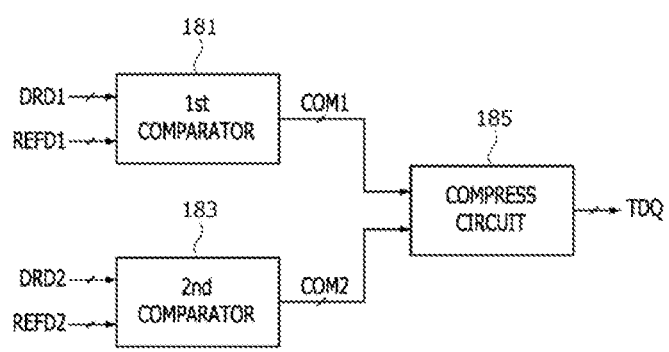
FIG. 31 is a block diagram illustrating a configuration according to an example of a test data generator included in the semiconductor device shown in FIG. 1.

FIG. 31 is a block diagram illustrating a configuration of a test data generator 19A according to an example of the test data generator 19 shown in FIG. 1. As illustrated in FIG. 31, the test data generator 19A may include a first comparator 181, a second comparator 183, and a compression circuit 185.

The first comparator 181 may compare the first drive data DRD1 and a first reference data REFD1 to generate a first comparison signal COM1. When pre-test or post-test is performed, the first comparator 181 may compare the first drive data DRD1 and the first reference data REFD1 to generate the first comparison signal COM1 having a logic bit set that is set according to a comparison result. As an example, the first comparator 181 may generate a first comparison signal COM1 composed of logic bits set to a logic "low" level when the logic bit set of the first drive data DRD1 and the logic bit set of the first reference data REFD1 are the same. As another example, the first comparator 181 may generate a first comparison signal COM1 set to have a logic bit set including at least one bit set to a logic "high" level when the logic bit set of the first drive data DRD1 and the logic bit set of the first reference data REFD1 are different.

The second comparator 183 may compare the second drive data DRD2 and a second reference data REFD2 to generate a second comparison data COM2. When the pre-test or post-test is performed, the second comparator 183 may compare the second drive data DRD2 and the second reference data REFD2 to generate the second comparison signal COM2 having a logic bit set that is set according to a comparison result. As an example, the second comparator 183 may generate a second comparison signal COM2 composed of logic bits set to a logic "low" level when the logic bit set of the second drive data DRD2 and the logic bit set of the second reference data REFD2 are the same. As another example, the second comparator 183 may generate a second comparison signal COM2 set to have a logic bit set including at least one bit set to a logic "high" level when the logic bit set of the second drive data DRD2 and the logic bit set of the second reference data REFD2 are different.

The compression circuit 185 may receive the first comparison signal COM1 from the first comparator 181 and the second comparison signal COM2 from the second comparator 183. The compression circuit 185 may compress the first comparison signal COM1 and the second comparison signal COM2 to generate test data TDQ. In an example, the compression circuit 185 may compress one of bits included in the first comparison signal COM1 and one of bits included in the second comparison signal COM2 to generate the test data TDQ. In another example, the compression circuit 185 may compress a plurality of bits among bits included in the first comparison signal COM1 and a plurality of bits among bits included in the second comparison signal COM2 to generate the test data TDQ.

Figure 32:
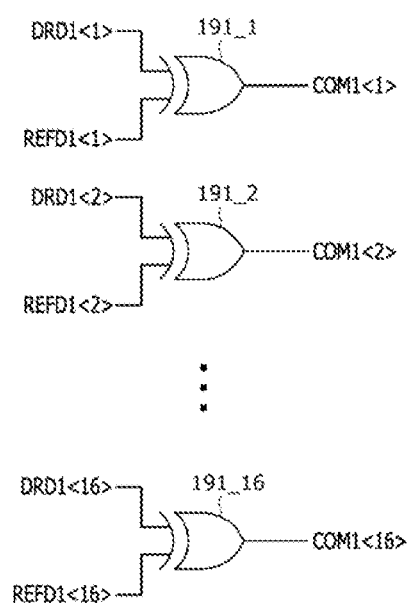
FIG. 32 is a circuit diagram according to an example of a first comparator included in the test data generator shown in FIG. 31.

FIG. 32 is a circuit diagram of a first comparator 181A according to an example of the first comparator 181 shown in FIG. 31. As illustrated in FIG. 32, the first comparator 181A may include a plurality of exclusive OR operators 191_1 to 191_16. The exclusive OR operator 191_1 may perform an exclusive logical OR operation on a first bit DRD1<1> of the first drive data and a first bit REFD1<1> of the first reference data to generate a first bit COM1<1> of the first comparison data. The exclusive OR operator 191_1 may generate a first bit COM1<1> of the first comparison data set to a logic "low" level when the first bit DRD1<1> of the first drive data and the first bit REFD1<1> of the first reference data have the same logic level, and may generate a first bit COM1<1> of the first comparison data set to a logic "high" level when the first bit DRD1<1> of the first drive data and the first bit REFD1<1> of the first reference data have different logic levels. The exclusive OR operator 191_2 may perform an exclusive logical OR operation on a second bit DRD1<2> of the first drive data and a second bit REFD1<2> of the first reference data to generate a second bit COM1<2> of the first comparison data. The exclusive OR operator 191_2 may generate a second bit COM1<2> of the first comparison data set to a logic "low" level when the second bit DRD1<2> of the first drive data and the second bit REFD1<2> of the first reference data have the same logic level, and may generate a second bit COM1<2> of the first comparison data set to a logic "high" level when the second bit DRD1<2> of the first drive data and the second bit REFD1<2> of the first reference data have different logic levels. The exclusive OR operator 191_16 may perform an exclusive logical OR operation on a sixteenth bit DRD1<16> of the first drive data and a sixteenth bit REFD1<16> of the first reference data to generate a sixteenth bit COM1<16> of the first comparison data. The exclusive OR operator 191_16 may generate a sixteenth bit COM1<16> of the first comparison data set to a logic "low" level when the sixteenth bit DRD1<16> of the first drive data and the sixteenth bit REFD1<16> of the first reference data have the same logic level, and may generate a sixteenth bit COM1<16> of the first comparison data set to a logic "high" level when the sixteenth bit DRD1<16> of the first drive data and the sixteenth bit REFD1<16> of the first reference data have different logic levels.

Figure 33:
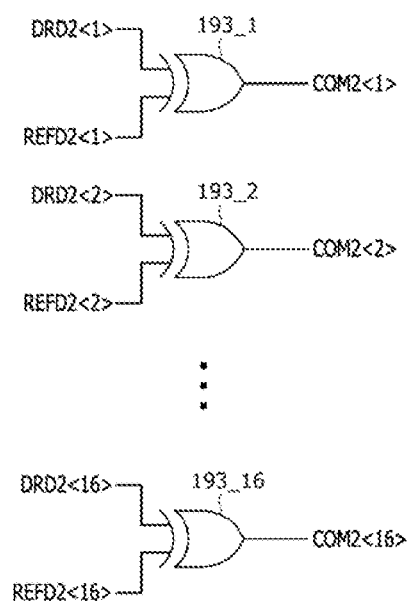
FIG. 33 is a circuit diagram according to an example of a second comparator included in the test data generator shown in FIG. 31.

FIG. 33 is a circuit diagram of a second comparator 183A according to an example of the second comparator 183 shown in FIG. 31. As illustrated in FIG. 33, the second comparator 183A may include a plurality of exclusive OR operators 193_1~193_16. The exclusive OR operator 193_1 may perform a logical exclusive OR operation on a first bit DRD2<1> of the second drive data and a first bit REFD2<1> of the second reference data to generate a first bit COM2<1> of the second comparison signal. The exclusive OR operator 193_2 may perform a logical exclusive OR operation on a second bit DRD2<2> of the second drive data and a second bit REFD2<2> of the second reference data to generate a second bit COM2<2> of the second comparison signal. The exclusive OR operator 193_16 may perform a logical exclusive OR operation on a sixteenth bit DRD2<16> of the second drive data and a sixteenth bit REFD2<16> of the second reference data to generate a sixteenth bit COM2<16> of the second comparison signal.

Figure 34:
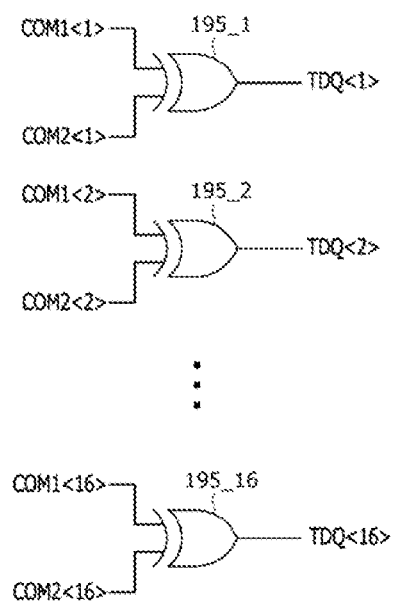
FIG. 34 is a circuit diagram according to an example of a compression circuit included in the test data generator shown in FIG. 31.

FIG. 34 is a circuit diagram of a compression circuit 185A according to an example of the compression circuit 185 shown in FIG. 31. As illustrated in FIG. 34, the compression circuit 185A may include a plurality of exclusive OR operators 195_1~195_16. The exclusive OR operator 195_1 may perform a logical exclusive OR operation on the first bit COM1<1> of the first comparison signal COM1 and the first bit COM2<1> of the second comparison signal COM2 to generate a first bit TD1<1> of the test data. The exclusive OR operator 195_2 may perform a logical exclusive OR operation on the second bit COM1<2> of the first comparison signal COM1 and the second bit COM2<2> of the second comparison signal COM2 to generate a second bit TD1<2> of the test data. The exclusive OR operator 195_16 may perform a logical exclusive OR operation on the sixteenth bit COM1<16> of the first comparison signal COM1 and the sixteenth bit COM2<16> of the second comparison signal COM2 to generate a sixteenth bit TD1<16> of the test data.

Figure 35:
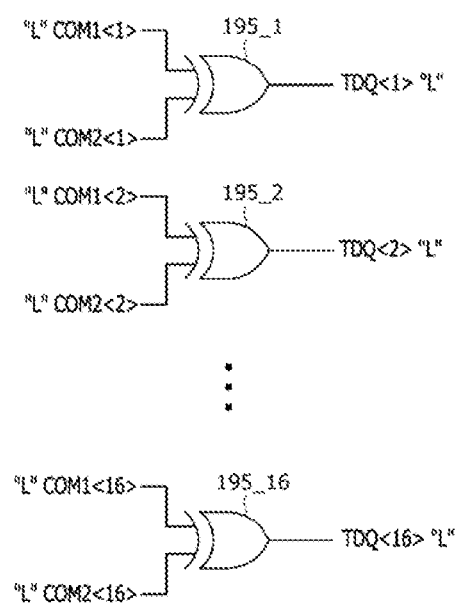
FIGS. 35 and 36 are diagrams for explaining an operation of the compression circuit shown in FIG. 34.
Figure 36:
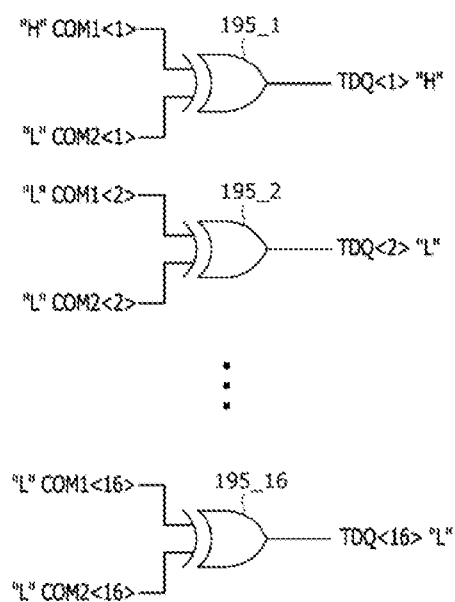

FIGS. 35 and 36 are diagrams illustrating an operation of the compression circuit 185A shown in FIG. 34.

As illustrated in FIG. 35, when all of the first to sixteenth bits COM1<1:16> of the first comparison signal are set to a logic "low" level, and all of the first to sixteenth bits COM2<1:16> of the second comparison signal are set to a logic "low" level, all of the first to sixteenth bits TDQ<1:16> of the test data are generated at a logic "low" level. It may be confirmed that no fail is included in the memory blocks MB included in a first memory block array 121 and the memory blocks MB included in a second memory block array 123, based on the first to sixteenth bits TDQ<1:16> of the test data all generated at a logic "low" level. More specifically, based on the first to sixteenth bits TDQ<1:16> of the test data all set to a logic "low" level generated in the pre-test, it may be confirmed that no fail occurs in the memory blocks MB included in the first memory block array 121 and the memory blocks MB included in the second memory block array 123. In addition, based on the first to sixteenth bits TDQ<1:16> of the test data generated in the post-test all set to a logic "low" level, it may be confirmed that the fails included in the memory blocks MB included in the first memory block array 121 and the memory blocks MB included in the second memory block array 123 have been normally repaired.

As illustrated in FIG. 36, when the first bit COM1<1> of the first comparison signal is set to a logic "high" level, all of the second to sixteenth bits COM1<2:16> of the first comparison signal are set to a logic "low" level, and all of the first to sixteenth bits COM2<1:16> of the second comparison signal are set to a logic "low" level, the first bit TDQ<1> of the test data is generated at a logic "high" level, and all of the second to sixteenth bits TDQ<2:16> of the test data are generated at a logic "low" level. It may be confirmed that fails are included in the first memory block MB included in the first memory block array 121 and the first memory block MB included in the second memory block array 123, based on the first bit TDQ<1> of the test data generated at a logic "high" level. More specifically, based on the first bit TDQ<1> of the test data of a logic "high" level generated in the pre-test, it may be confirmed that the fails have occurred in the first memory block MB included in the first memory block array 121 and the first memory block MB included in the second memory block array 123. In addition, based on the first bit TDQ<1> of the test data of a logic "high" level generated in the post-test, it may be confirmed that the fails occurred in the first memory block MB included in the first memory block array 121 and the first memory block MB included in the second memory block array 123 have not been normally repaired.

The semiconductor device of the present disclosure as described above reduces the number of redundancy fuses required for the repair operation by implementing the redundancy fuses corresponding to the plurality of column lines, so that it may be possible to reduce the layout area required to implement the redundancy fuses. In addition, before the repair operation is performed, the semiconductor device of the present disclosure compresses data output from the memory blocks on which the repair operation is performed and confirms the existence of a fail cell, so that it may be possible to reduce the time required for performing pre-test for checking a fail cell requiring repair. In addition, after the repair operation is performed, the semiconductor device of the present disclosure compresses data output from the same column line of a plurality of memory blocks to confirm the existence of a fail cell, so that it may be possible to reduce the time for which post-test is performed to confirm whether the repair operation for the fail cell has been properly performed.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
a memory bank including a first memory block, a second memory block, and a redundancy memory block; and
a column line selection circuit configured, when a fail occurs in a first column line of the first memory block, to control a first repair operation of replacing the first column line of the first memory block with a first redundancy line of the redundancy memory block, and a second repair operation of replacing a second column line of the second memory block with a second redundancy line of the redundancy memory block to be performed simultaneously,
wherein when the first repair operation and the second repair operation is performed simultaneously, the first repair operation takes place over a first interval of time and the second repair operation takes place over a second interval of time and the first and second intervals of time at least partially overlap each other.

2. The semiconductor device of claim 1,
wherein the memory bank includes a first memory block array and a second memory block array, and
wherein the first memory block is included in the first memory block array, and the second memory block is included in the second memory block array.

3. The semiconductor device of claim 2, wherein the column line selection circuit selects at least one of the first memory block array and the second memory block array based on a block array address.

4. The semiconductor device of claim 1, wherein the column line selection circuit selects at least one of the first memory block and the second memory block based on a block address.

5. The semiconductor device of claim 1,
wherein the column line selection circuit selects one of the first column line and the second column line based on a column address,
wherein the first column line is selected when the column address has a first logic bit set, and the second column line is selected when the column address has a second logic bit set, and
wherein the second logic bit set is set by inverting at least one bit among bits included in the first logic bit set.

6. The semiconductor device of claim 1,
wherein the column line selection circuit selects one of the first column line and the second column line based on a column address,
wherein the first column line is selected when the column address has a first logic bit set, and the second column line is selected when the column address has a second logic bit set, and
wherein the second logic bit set is set by inverting a most significant bit among bits included in the first logic bit set.

7. The semiconductor device of claim 1,
wherein the first memory block includes a first column line set and a second column line set, and the second memory block includes a third column line set and a fourth column line set, and
wherein the first column line set and the third column line set are selected when a most significant bit of the column address is at a first logic level, and the second column line set and the fourth column line set are selected when a most significant bit of the column address is at a second logic level.

8. The semiconductor device of claim 7, wherein when the first column line is included in the first column line set, the second column line is included in the fourth column line set.

9. The semiconductor device of claim 7, wherein when the first column line is included in the second column line set, the second column line is included in the third column line set.

10. The semiconductor device of claim 1, further comprising a redundancy fuse latch corresponding to the first column line and the second column line,
wherein the redundancy fuse latch stores redundancy fuse data including information on the first memory block and information on the first column line and applies the redundancy fuse data to the column line selection circuit.

11. The semiconductor device of claim 1, wherein when a fail occurs in the second column line of the first memory block, the column line selection circuit replaces the second column line of the first memory block with the first redundancy line of the redundancy memory block and replaces the first column line of the second memory block with the second redundancy line of the redundancy memory block.

12. A semiconductor device comprising:
a test column address generator configured to generate a first test column address and a second test column address based on a column address; and
a core circuit configured to control a first repair operation for a first memory block array and a second repair operation for a second memory block array to be performed simultaneously based on a block array address, a block address, and the column address, select one of column lines of each of memory blocks included in the first memory block array to output first memory block data based on the first test column address, and select one of column lines of each of memory blocks included in the second memory block array to output second memory block data based on the second test column address, wherein when the first repair operation and the second repair operation is performed simultaneously, the first repair operation takes place over a first interval of time and the second repair operation takes place over a second interval of time and the first and second intervals of time at least partially overlap each other.

13. The semiconductor device of claim 12, wherein the test column address generator generates the first test column address and the second test column address that are set to have different logic bit sets in a pre-test performed before the first repair operation and the second repair operation are performed.

14. The semiconductor device of claim 13, wherein the test column address generator generates the first test column address based on the column address, and converts at least one of bits included in the column address to generate the second test column address.

15. The semiconductor device of claim 12, wherein the test column address generator generates the first test column address and the second test column address that are set to have the same logic bit set in a post-test performed after the first repair operation and the second repair operation are performed.

16. The semiconductor device of claim 12,
wherein the core circuit includes a memory bank, and
wherein the memory bank includes a first memory block included in the first memory block array, a second memory block included in the second memory block array, and a redundancy memory block.

17. The semiconductor device of claim 12,
wherein the core circuit includes a column line selection circuit, and
wherein when a fail occurs in a first column line of the first memory block included in the first memory block array, the column line selection circuit controls a first repair operation of replacing the first column line of the first memory block with a first redundancy line of the redundancy memory block and a second repair operation of replacing a second column line of the second memory block included in the second memory block array with a second redundancy line of the redundancy memory block to be performed together.

18. The semiconductor device of claim 17,
wherein the column line selection circuit selects one of the first column line and the second column line based on the column address,
wherein the first column line is selected when the column address has a first logic bit set, and the second column line is selected when the column address has a second logic bit set, and
wherein the second logic bit set is set by inverting at least one bit among bits included in the first logic bit set.

19. The semiconductor device of claim 17,
wherein the first memory block includes a first column line set and a second column line set, and the second memory block includes a third column line set and a fourth column line set, and
wherein the first column line set and the third column line set are selected when a most significant bit of the column address is at a first logic level, and the second column line set and the fourth column line set are selected when a most significant bit of the column address is at a second logic level.

20. The semiconductor device of claim 19, wherein when the first column line is included in the first column line set, the second column line is included in the fourth column line set.

21. The semiconductor device of claim 19, wherein when the first column line is included in the second column line set, the second column line is included in the third column line set.

22. The semiconductor device of claim 17, wherein the core circuit further includes a redundancy fuse latch, and
wherein the redundancy fuse latch corresponds to the first column line and the second column line, stores redundancy fuse data including information on the first memory block and information on the first column line, and applies the redundancy fuse data to the column line selection circuit.

23. The semiconductor device of claim 17, wherein when a fail occurs in the second column line of the first memory block, the column line selection circuit controls a third repair operation of replacing the second column line of the first memory block with the first redundancy line of the redundancy memory block and a fourth repair operation of replacing the first column line of the second memory block with the second redundancy line of the redundancy memory block to be performed together.

24. The semiconductor device of claim 12, wherein the core circuit repairs at least one memory block in which a fail has occurred in a column line selected based on the first test column address among the memory blocks included in the first memory block array and outputs redundancy memory block data.

25. The semiconductor device of claim 24, further comprising a shifting control circuit,
wherein the shifting control circuit generates a first shifting signal activated when a fail cell is included in at least one of the memory blocks included in the first memory block array and repaired based on the first test column address.

26. The semiconductor device of claim 24, further comprising an input and output (input/output) control circuit,
wherein the input/output control circuit includes a first input/output shifting circuit outputting the first memory block data based on the first shifting signal or shifting and outputting a portion of the first memory block data and the redundancy memory block data.

27. The semiconductor device of claim 26, wherein the input/output control circuit outputs the first memory block data when the first shifting signal is deactivated, and shifts and outputs a portion of the first memory block data and the redundancy memory block data when the first shifting signal is activated.

28. The semiconductor device of claim 26, wherein the input/output control circuit further includes a first driving circuit,
wherein the first driving circuit generates a first drive signal based on the first memory block data received when the first shifting signal is deactivated, and generates the first drive signal based on the portion of the first memory block data and the redundancy memory block data that are shifted and received when the first shifting signal is activated.

29. The semiconductor device of claim 12,
wherein the core circuit is configured to:
repair at least one memory block in which a fail has occurred in a column line selected based on the first test column address, among the memory blocks included in the first memory block array; or
output redundancy memory block data when repairing at least one memory block in which a fail has occurred in a column line selected based on the second test column address, among the memory blocks included in the second memory block array.

30. The semiconductor device of claim 29, further comprising a shifting control circuit,
wherein the shifting control circuit includes:
a fuse data decoder generating a fuse flag, fuse column data, and a fuse latch signal based on the redundancy fuse data; and
a shifting signal generator generating the first shifting signal and the second shifting signal based on the fuse flag, the fuse column data, and the fuse latch signal.

31. The semiconductor device of claim 29, further comprising an input/output control circuit,
wherein the input/output control circuit generates first drive data and second drive data from the first memory block data, the second memory block data, and the redundancy memory block data based on the first shifting signal and the second shifting signal.

32. The semiconductor device of claim 31, further comprising a test data generator,
wherein the test data generator compares the first drive data and first reference data to generate a first comparison signal, by comparing the second drive data and second reference data to generate a second comparison signal, and by compressing the first comparison signal and the second comparison signal to generate test data.

33. A semiconductor device comprising:
a core circuit configured to:
control a first repair operation on a first memory block array and a second repair operation on a second memory block array to be performed together based on a block array address, a block address, and a column address;
select one of column lines of each of memory blocks included in the first memory block array based on a first test column address to output first memory block data;
select one of column lines of each of memory blocks included in the second memory block array based on a second test column address to output second memory block data; and
output redundancy memory block data when the repair operation on the first memory block array is performed based on the first test column address or the repair operation on the first memory block array is performed based on the second test column address;
an input and output (input/output) control circuit configured to generate first drive data and second drive data from the first memory block data, the second memory block data, and the redundancy memory block data based on a first shifting signal and a second shifting signal; and
a test data generator configured to compare the first drive data and first reference data to generate a first comparison signal, compare the second drive data and second reference data to generate a second comparison signal, and compress the first comparison signal and the second comparison signal to generate test data.

* * * * *